United States Patent
Lu et al.

(10) Patent No.: US 12,302,590 B2
(45) Date of Patent: May 13, 2025

(54) FERROELECTRIC MFM CAPACITOR ARRAY AND METHODS OF MAKING THE SAME

(71) Applicant: Taiwan Semiconductor Manufacturing Company Limited, Hsinchu (TW)

(72) Inventors: Chun-Chieh Lu, Taipei (TW); Mauricio Manfrini, Zhubei (TW); Marcus Johannes Hendricus Van Dal, Linden (BE); Chih-Yu Chang, Taipei (TW); Sai-Hooi Yeong, Zhubei (TW); Yu-Ming Lin, Hsinchu (TW); Georgios Vallianitis, Heverlee (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/363,217

(22) Filed: Aug. 1, 2023

(65) Prior Publication Data

US 2023/0387186 A1    Nov. 30, 2023

Related U.S. Application Data

(62) Division of application No. 17/222,193, filed on Apr. 5, 2021, now Pat. No. 12,154,938.

(60) Provisional application No. 63/031,732, filed on May 29, 2020.

(51) Int. Cl.
| | |
|---|---|
| H10D 1/68 | (2025.01) |
| H01L 21/321 | (2006.01) |
| H01L 21/3213 | (2006.01) |

(52) U.S. Cl.
CPC .......... H10D 1/68 (2025.01); H01L 21/3212 (2013.01); H01L 21/32136 (2013.01)

(58) Field of Classification Search
CPC ....... H01L 28/40–92; H01L 2924/1205; H01L 2924/19041; H01L 28/55–57; H01L 23/522–53295; H01L 21/768–76898; H10B 53/00–50; H10D 1/682–688
See application file for complete search history.

(56) References Cited

U.S. PATENT DOCUMENTS

| | | | | |
|---|---|---|---|---|
| 5,760,432 A * | 6/1998 | Abe | .................. | H10B 12/03 257/295 |
| 6,645,810 B2 * | 11/2003 | Ng | .................. | H01L 21/768 257/E27.048 |
| 2004/0053466 A1 * | 3/2004 | Mikawa | .................. | H01L 28/60 257/E21.244 |

(Continued)

*Primary Examiner* — Eric A. Ward
*Assistant Examiner* — Nora T. Nix
(74) *Attorney, Agent, or Firm* — The Marbury Law Group, PLLC

(57) ABSTRACT

Embodiments include structures and methods for fabricating an MFM capacitor having a plurality of metal contacts. An embodiment may include a first metal strip, disposed on a substrate and extending in a first direction, a ferroelectric blanket layer, disposed on the first metal strip, a second metal strip, disposed on the ferroelectric blanket layer and extending in a second direction different from the first direction, and a plurality of metal contacts disposed between the first metal strip and the second metal strip and located within an intersection region of the first metal strip and the second metal strip.

20 Claims, 14 Drawing Sheets

(56) References Cited

U.S. PATENT DOCUMENTS

| | | | |
|---|---|---|---|
| 2006/0073616 A1* | 4/2006 | Ohashi | H10B 53/00 257/E21.664 |
| 2011/0248778 A1* | 10/2011 | Sandhu | H10N 52/01 257/295 |
| 2013/0062733 A1* | 3/2013 | Summerfelt | H10B 53/40 257/532 |

* cited by examiner

FERROELECTRIC MFM CAPACITOR ARRAY AND METHODS OF MAKING THE SAME

RELATED APPLICATIONS

This application is a divisional application of U.S. patent application Ser. No. 17/222,193 entitled "Ferroelectric MFM Capacitor Array and Methods of Making the Same," filed on Apr. 5, 2021, which claims priority to U.S. Provisional Patent Application No. 63/031,732 entitled "Ferroelectric MFM Capacitor and Forming Method thereof" filed on May 29, 2020, the entire contents of both of which are hereby incorporated by reference for all purposes.

BACKGROUND

A ferroelectric capacitor is a capacitor based on a ferroelectric (FE) material. In contrast, traditional capacitors are based on dielectric materials. Ferroelectric devices are used in digital electronics as part of ferroelectric RAM, or in analog electronics as tunable capacitors (varactors). Ferroelectric capacitors possess the two characteristics required for a nonvolatile memory cell, that is they have two stable states corresponding to the two binary levels in a digital memory, and they retain their states without electrical power. Although similar characteristics exist in ferromagnetic cores of a core memory, ferroelectric capacitors switch faster and they can also be fabricated on a single VLSI chip. In memory applications, the stored value of a ferroelectric capacitor is read by applying an electric field. The amount of charge needed to flip the memory cell to the opposite state is measured and the previous state of the cell is revealed. This means that the read operation destroys the memory cell state, and has to be followed by a corresponding write operation, in order to write the bit back. This makes it similar to the ferrite core memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
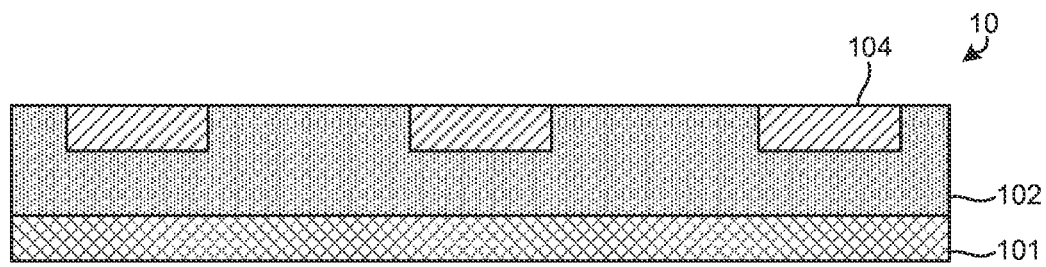
FIG. 1A is a vertical cross-sectional view of the first exemplary structure through vertical plane AA' of FIG. 1B illustrating a step of forming a bottom metal contact layer 104 in a semiconductor die 10 in a method for fabricating an MFM capacitor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to metal-ferroelectric metal (MFM) devices, and specifically to electrical measurement in MFM capacitors having a small ferroelectric area and methods of making such small ferroelectric area MFM capacitors.

Capacitors having metal-ferroelectric metal (MFM) structures may be used to determine ferroelectric properties of a device such as data retention and write endurance. Data retention refers to the ability of a memory bit to retain its data state over long periods of time regardless of whether the component is powered on or powered off. Write endurance refers to the number of program/erase (P/E cycles) that can be applied to a block of flash memory before the storage media becomes unreliable. In order to increase device density, the size of the MFM capacitor may be reduced. However, MFM capacitors suffer from noisy switching current when reducing the size of the active FE area, such that properties such as retention and endurance may not be properly characterized if the switching current exhibits a noise level above a tolerable noise threshold. Thus, the active FE areas of conventional MFM capacitors may be physically constrained to be at least a certain area (e.g., greater than 5 micrometers ($\mu m$) by 5 $\mu m$) to ensure switching current noise does not affect the MFM capacitor properties. By providing a larger FE area, a MFM capacitor may operate with reduced switching current noise when measuring the MFM capacitor's properties across the active FE area. As such, the active FE areas of MFM capacitors may not be smaller than 5 $\mu m$ by 5 $\mu m$ (e.g., 1 $\mu m$ by 1 $\mu m$) because the switching noise may be too significant to effectively analyze the MFM capacitor's characteristics. However, in order to achieve greater device density, it may be desired to fabricate an MFM capacitor with a smaller FE area while mitigating switching noise.

Various embodiments disclosed herein allow for the fabrication and implementation of a plurality of small FE areas (e.g., 50 nm by 50 nm) to form an MFM capacitor array with a total area sufficiently large enough (e.g., 1 $\mu m$ by 1 $\mu m$) to maintain sufficient current flow. The total area of the MFM capacitor array comprising small FE areas can allow for sufficient current flow while reducing the switching current noise across each small FE area within the MFM capacitor array. The small FE area (e.g. 50 nm by 50 nm) may be defined by small metal top-electrodes, in which each small metal-top electrode within the array are connected using a cross-bar structure to form the MFM capacitor. With switching current noise reduced, extremely small FE area signals may be measured at each small FE area to characterize intrinsic FE properties such as remanent polarization (Pr), coercive field (Ec), data retention, and write endurance.

In various embodiments disclosed herein, a process flow is described for fabricating a cross-bar structure for creating a parallel connection of several small area FE capacitors that may allow for the characterization of Pr and Ec variation while scaling the active FE area. Etching techniques, such as ion beam etching may be utilized to form patterns of small metal contacts disposed on top of a layer of FE film. Each of the contacts within the array of small metal contacts may have a critical dimension of 50 to 80 nanometers (nm), such that the width/length of each metal contact from a top-down perspective view is between 50 to 80 nm, although larger metal contacts may also be used. In various embodiments, the metal contacts may be fabricated or otherwise positioned to be located between a bottom metal strip and a top metal strip acting as electrodes, in which the metal contacts are in electrical connection with the bottom metal strip and top metal strip. The combination of bottom metal strip, FE blanket layer, and top metal strips with metal contacts may form an array structure creating an MFM capacitor. In this manner, the various embodiment array structures disclosed herein may enable measurement of signals from small ferroelectric material portions (e.g., smaller than 5 μm by 5 μm) by increasing the magnitude of the total measurement current above the measurement threshold, i.e., by increasing the signal-to-noise ratio above measurement threshold. Thus, the MFM array structure of the present disclosure may overcome measurement noise introduced by various parasitic effects of the ferroelectric device to allow for the measurement and characterization of Pr, Er, data retention, and write endurance.

Figure 1B:
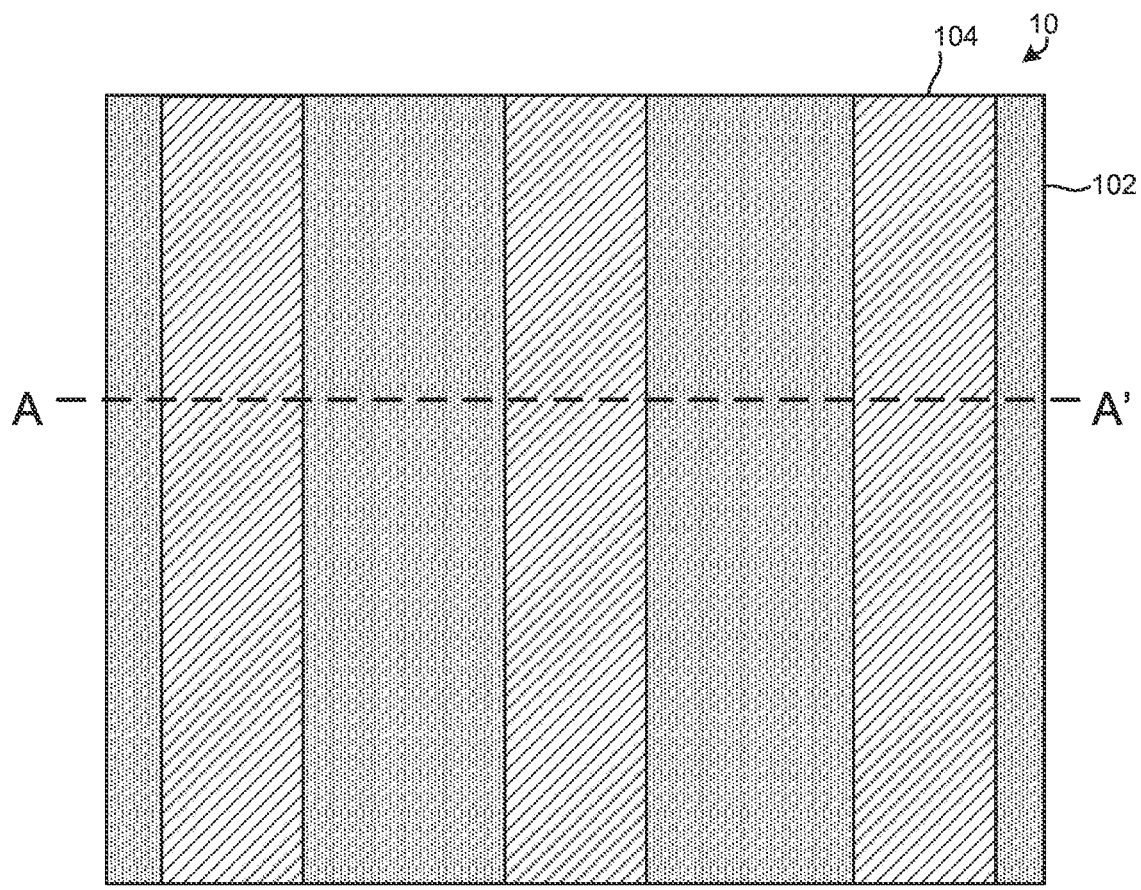
FIG. 1B is a top-down perspective view illustrating a step of forming a bottom metal contact layer 104 in a semiconductor die 10 in a method for fabricating an MFM capacitor in accordance with some embodiments of the present disclosure.

FIG. 1A is a vertical cross-sectional view of the first exemplary structure through vertical plane AA' of FIG. 1B illustrating a step of forming a bottom metal contact layer 104 in a semiconductor die 10 in a method for fabricating an MFM capacitor in accordance with some embodiments of the present disclosure. FIG. 1B is a top-down perspective view illustrating a step of forming a bottom metal contact layer 104 in a semiconductor die 10 in a method for fabricating an MFM capacitor in accordance with some embodiments of the present disclosure. The dashed line AA' illustrated in FIG. 1B indicates a cross-sectional cut of the semiconductor die 10 representing the vertical cross-section view as shown in FIG. 1A.

Referring to FIG. 1A, a semiconductor die 10 having circuit elements formed thereon may be provided. The semiconductor die 10 may include a silicon substrate layer 101 and a first passivation layer 102. The first passivation layer 102 may protect the top surface of the silicon substrate layer 101. The semiconductor substrate layer 101 may be made of any suitable material, such as silicon, silicon on insulator (SOI) or silicon on sapphire (SOS). The semiconductor substrate layer 101 may include electrical dopants (such as p-type dopants or n-type dopants) at an atomic concentration less than $1.0 \times 10^{14}/cm^3$ in order to provide low electrical conductivity and to minimize eddy current that may be induced by inductive coupling with high frequency electrical signals from, to, or between semiconductor die 10s or redistribution wiring interconnects to be subsequently placed in proximity. The first passivation layer 102 may be made of silicon dioxide ($SiO_2$) or any material conventionally used for depositing a passivation layer. Other suitable passivation materials are within the contemplated scope of disclosure. The first passivation layer 102 may be deposited over the semiconductor substrate layer 101 by any suitable method. For example, the materials for the first passivation layer 102 may be deposited by physical vapor deposition (PVD), chemical vapor deposition (CVD), atomic layer deposition (ALD), or any epitaxial deposition method.

A photoresist layer (not shown) may be deposited over the passivation layer 102 and photolithographically patterned. Using the patterned photoresist layer to mask portions of the passivation layer 102. The passivation layer 102 may then be etched to form channels in the passivation layer 102. The photoresist layer may be removed, for example, by ashing.

The bottom metal contact layer 104 material may be deposited over the masked first passivation layer 102 so as to fill the channels with the bottom metal contact layer 104 material. A planarization process, such as a chemical mechanical polish (CMP) process, may be performed to render a top surface of the bottom metal contact layer 104 co-planar with a top surface of the first passivation layer 102. Thus, the bottom metal contact layer may include multiple metal strips (i.e. multiple bottom metal contacts) that may be deposited within the first passivation layer 102. The bottom metal contact layer 104 material may be deposited over the first passivation layer 102 by any suitable method. For example, the materials for the bottom metal contact layer 104 may be deposited by PVD, CVD, and plasma-enhanced CVD (PECVD) or other suitable methods.

In various embodiments, the bottom metal contact layer 104 that may be pattered into strips may be made of titanium nitride (TiN), tantalum nitride (TaN), tungsten (W), ruthenium (Ru), or aluminum (Al) or any combination alloys thereof. Other suitable materials for the bottom metal layer 104 are within the contemplated scope of disclosure. In various embodiments, the bottom metal contact layer 104 may be deposited using any known method, including PVD, CVD, and plasma-enhanced CVD (PECVD).

Figure 2A:
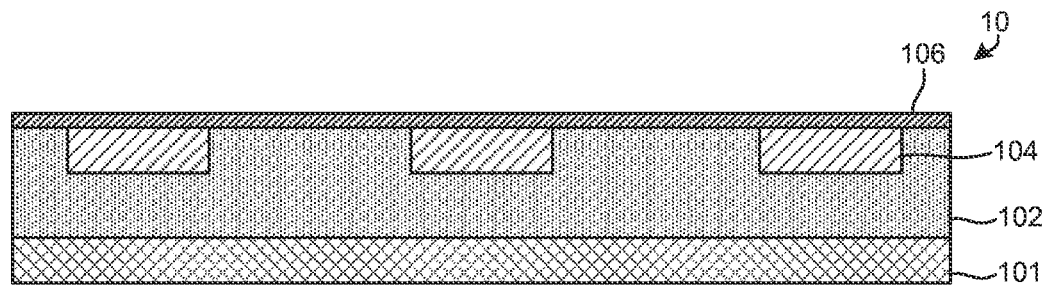
FIG. 2A is a vertical cross-sectional view of the first exemplary structure through vertical plane AA' of FIG. 2B illustrating a step of depositing a ferroelectric (FE) blanket layer 106 in a semiconductor die 10 in a method for fabricating an MFM capacitor in accordance with some embodiments of the present disclosure.
Figure 2B:
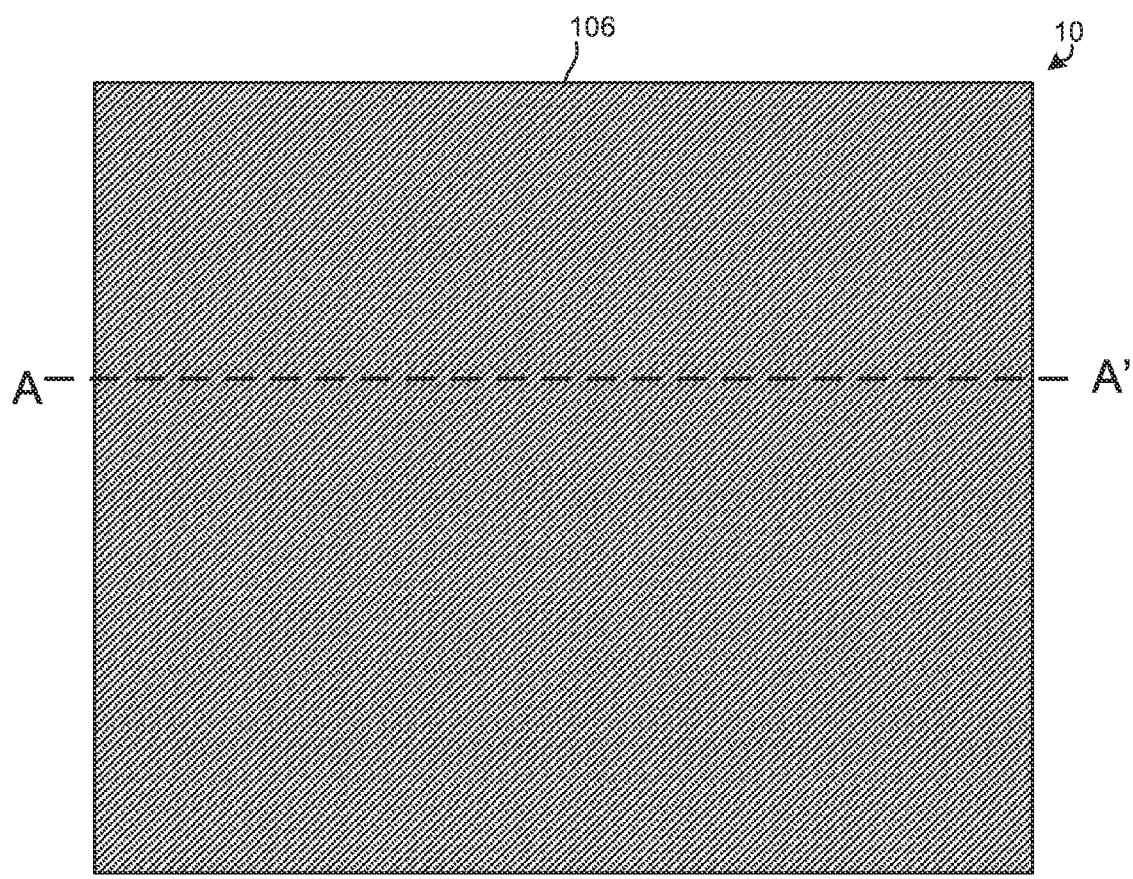
FIG. 2B is a top-down perspective view illustrating a step of depositing a FE blanket layer 106 in a semiconductor die 10 in a method for fabricating an MFM capacitor in accordance with some embodiments of the present disclosure.

FIG. 2A is a vertical cross-sectional view through vertical plane AA' of FIG. 2B illustrating a step of depositing a FE blanket layer 106 in a semiconductor die 10 in a method for fabricating an MFM capacitor in accordance with some embodiments of the present disclosure. FIG. 2B is a top-down perspective view illustrating a step of depositing a FE blanket layer 106 in a semiconductor die 10 in a method for fabricating an MFM capacitor in accordance with some embodiments of the present disclosure. Referring to FIG. 2A, an FE blanket layer 106 may be deposited over the surfaces of the co-planar bottom metal contact layer 104 and the first passivation layer 102. In various embodiments, the FE blanket layer 106 may be made of hafnium zirconium oxide (HfZrO), hafnium aluminum oxide (HfAlO), hafnium lanthanum oxide (HfLaO), hafnium cerium oxide (HfCeO), hafnium oxide (HfO), hafnium gadolinium oxide (HfGdO), and hafnium silicon oxide (HfSiO). Other suitable materials for the FE blanket layer 106 are within the contemplated scope of disclosure. In various embodiments, the FE blanket layer 106 may be deposited using any known method, including PVD, PECVD, ALD, or plasma-enhanced ALD (PEALD).

Figure 3A:
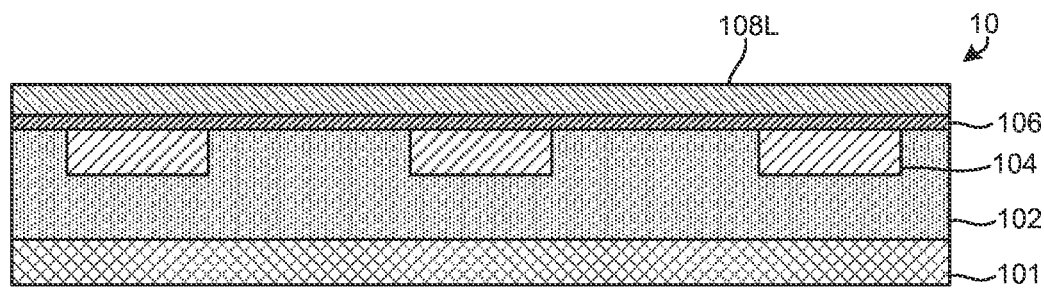
FIG. 3A is a vertical cross-sectional view of the first exemplary structure through vertical plane AA' of FIG. 3B illustrating a step of depositing a middle metal contact layer 108L in a semiconductor die 10 in a method for fabricating an MFM capacitor in accordance with some embodiments of the present disclosure.
Figure 3B:
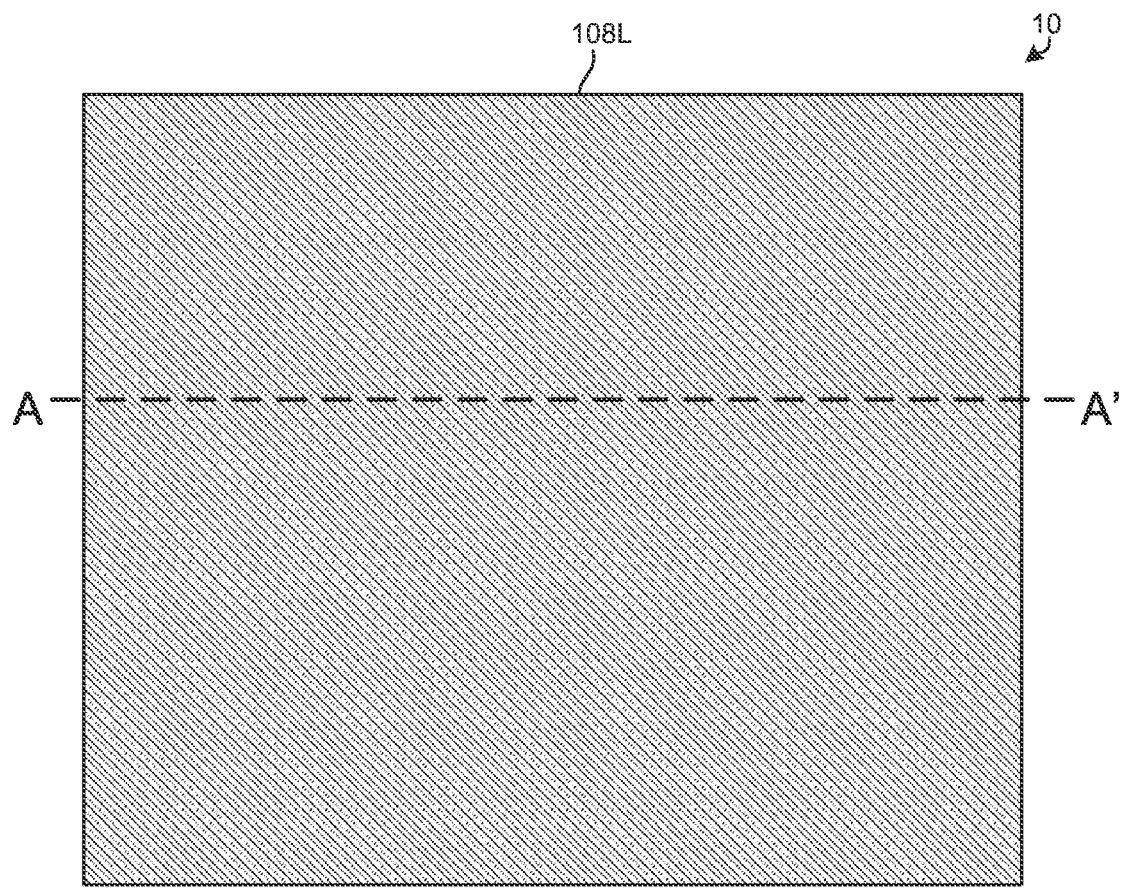
FIG. 3B is a top-down perspective view illustrating a step of depositing a middle metal contact layer 108L in a semiconductor die 10 in a method for fabricating an MFM capacitor in accordance with some embodiments of the present disclosure.

FIG. 3A is a vertical cross-sectional view through vertical plane AA' of FIG. 3B illustrating a step of depositing a middle metal contact layer 108L in a semiconductor die 10 in a method for fabricating an MFM capacitor in accordance with some embodiments of the present disclosure. FIG. 3B is a top-down perspective view illustrating a step of depositing a middle metal contact layer 108L in a semiconductor die 10 in a method for fabricating an MFM capacitor in accordance with some embodiments of the present disclosure. Referring to FIG. 3A, the middle metal contact layer 108L may be deposited over the FE blanket layer 106. The middle metal contact layer 108L may be used to subsequently form an array of metal contacts within the MFM capacitor. In various embodiments, the middle metal contact layer 108L may be made of TiN, TaN, W, Ru, or Al. Other suitable materials for the middle metal contact layer 108L are within the contemplated scope of disclosure. In various embodiments, the middle metal contact layer 108L may be deposited using any known method, including PVD, CVD, and PECVD.

Figure 4A:
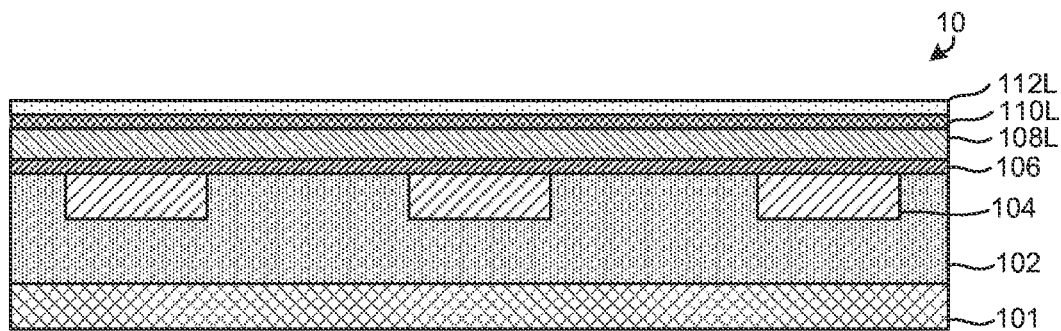
FIG. 4A is a vertical cross-sectional view of the first exemplary structure through vertical plane AA' of FIG. 4B illustrating a step of depositing pre-etching layers in a semiconductor die 10 in a method for fabricating an MFM capacitor in accordance with some embodiments of the present disclosure.
Figure 4B:
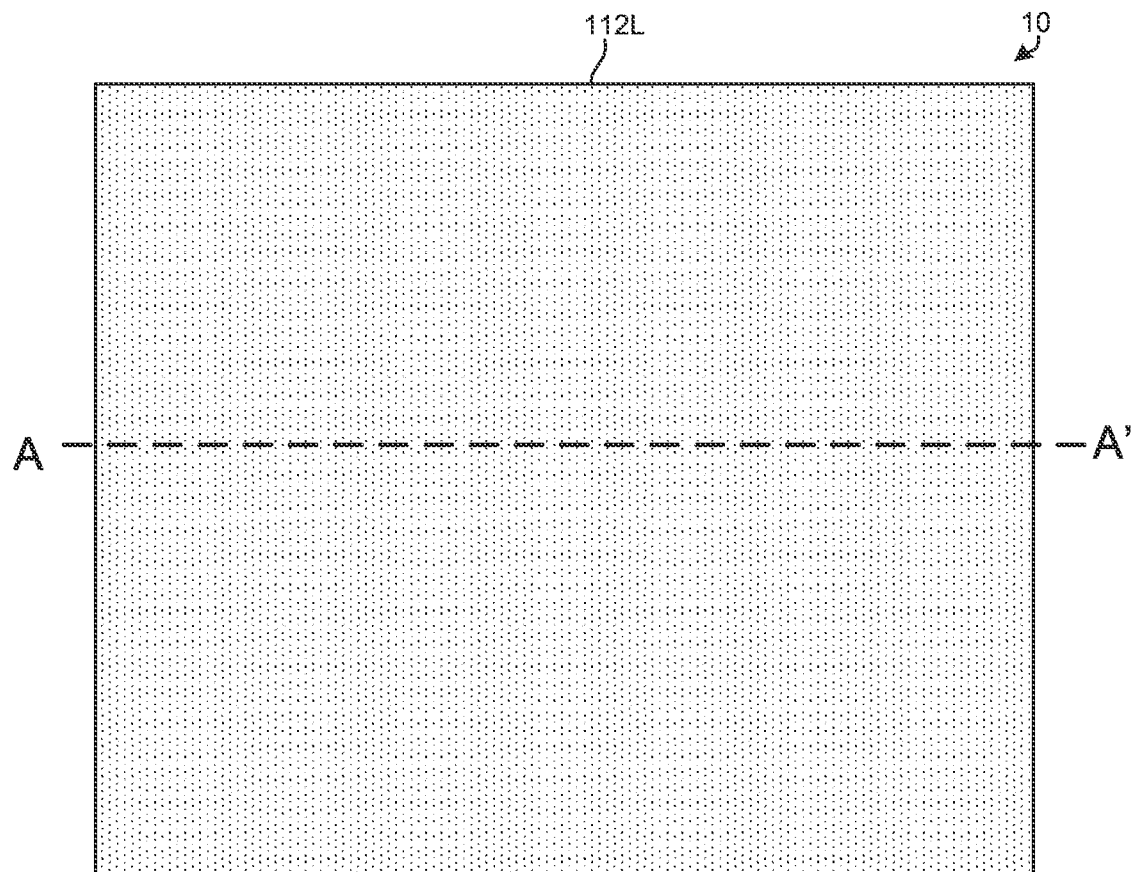
FIG. 4B is a top-down perspective view illustrating a step of depositing pre-etching layers in a semiconductor die 10 in a method for fabricating an MFM capacitor in accordance with some embodiments of the present disclosure.

FIG. 4A is a vertical cross-sectional view through vertical plane AA' of FIG. 4B illustrating a step of depositing pre-etching layers in a semiconductor die 10 in a method for fabricating an MFM capacitor in accordance with some embodiments of the present disclosure. FIG. 4B is a top-down perspective view illustrating a step of depositing pre-etching layers in a semiconductor die 10 in a method for fabricating an MFM capacitor in accordance with some embodiments of the present disclosure. Referring to FIG. 4A, a first pre-etching layer 110L may be deposited over the middle metal contact layer 108L in preparation of performing ion beam etching. The first pre-etching layer 110L may be any suitable material such as an $SiO_2$ hard-mask layer, and may be deposited using any suitable known method. A second pre-etching layer 112L may be deposited over the first pre-etching layer 110L in preparation of performing ion beam etching. The second pre-etching layer 112L may be deposited over the pre-etching layer 110L using any suitable known method, and may be any suitable material such as a self-planarizing dielectric material such as spin-on-glass (SOG) layer or a spin-on carbon (SOC) layer. The first pre-etching layer 110L and the second pre-etching layer 112L may also be referred to as etching hard masks.

Figure 5A:
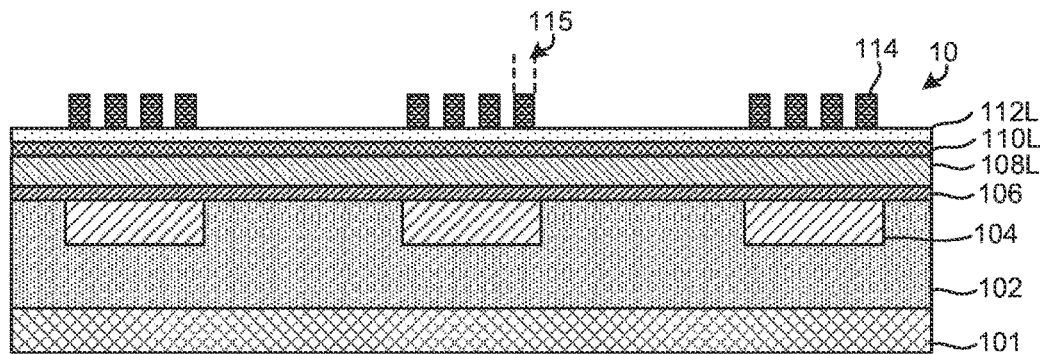
FIG. 5A is a vertical cross-sectional view of the first exemplary structure through vertical plane AA' of FIG. 5B illustrating a step of depositing a photoresist layer 114 in a semiconductor die 10 in a method for fabricating an MFM capacitor in accordance with some embodiments of the present disclosure.
Figure 5B:
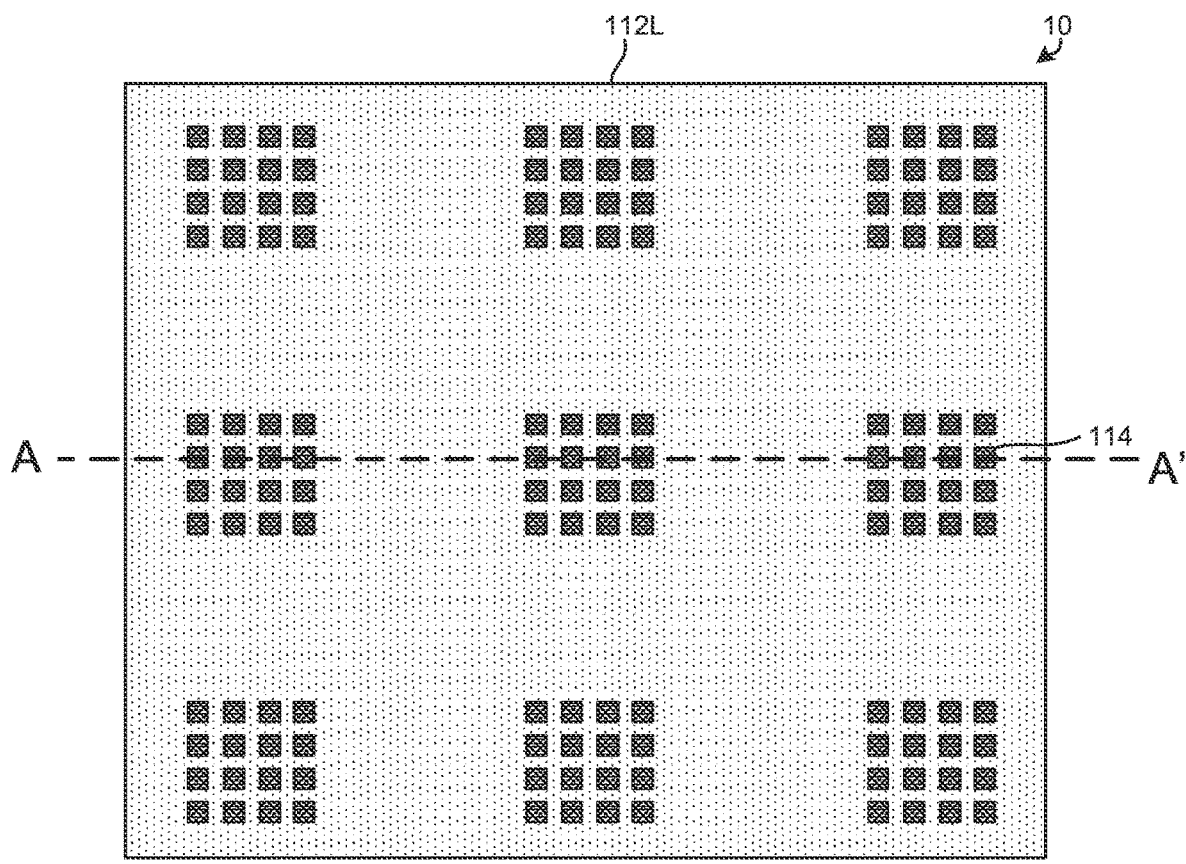
FIG. 5B is a top-down perspective view illustrating a step of depositing a photoresist layer 114 in a semiconductor die 10 in a method for fabricating an MFM capacitor in accordance with some embodiments of the present disclosure.

FIG. 5A is a vertical cross-sectional view through vertical plane AA' of FIG. 5B illustrating a step of depositing a photoresist layer 114 in a semiconductor die 10 in a method for fabricating an MFM capacitor in accordance with some embodiments of the present disclosure. FIG. 5B is a top-down perspective view illustrating a step of depositing a photoresist layer 114 in a semiconductor die 10 in a method for fabricating an MFM capacitor in accordance with some embodiments of the present disclosure. The dashed line illustrated in FIG. 5B indicates a cross-sectional cut of the semiconductor die 10 representing the vertical cross-section view as shown in FIG. 5A.

In various embodiments, photolithography may be used to transfer a pattern onto the photoresist layer 114. The patterned photoresist layer 114 may serve to mask portions of the second pre-etching layer 112L that may be used as a hard mask in the formation of middle metal contacts formed from the middle metal contact layer 108L during a subsequent ion beam etching process (see FIG. 8A, 8B description below). The photoresist layer 114 may be deposited on top of the second pre-etching layer 112L. Using photolithography, the photoresist layer 114 may be patterned to form an appropriate mask defining the dimensions of the hard mask formed from the second pre-etching layer 112L. In various embodiments, the photoresist layer 114 may be patterned to produce photoresist portions having a width of 25 nm to 100 nm, such as 50 to 80 nm, although greater or lesser thicknesses may be used. For example, the width 115 of a portion of the photoresist layer 114 may be 50 to 80 nm.

Figure 6A:
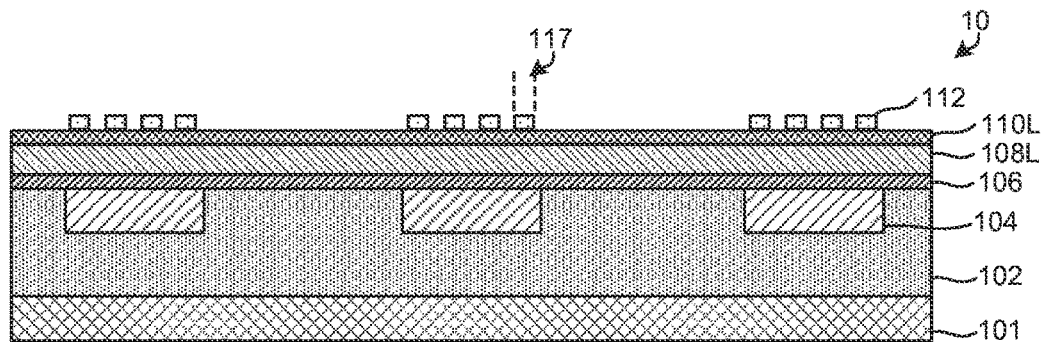
FIG. 6A is a vertical cross-sectional view of the first exemplary structure through vertical plane AA' of FIG. 6B illustrating a step of etching hard mask portions 112 in a semiconductor die 10 in a method for fabricating an MFM capacitor in accordance with some embodiments of the present disclosure.
Figure 6B:
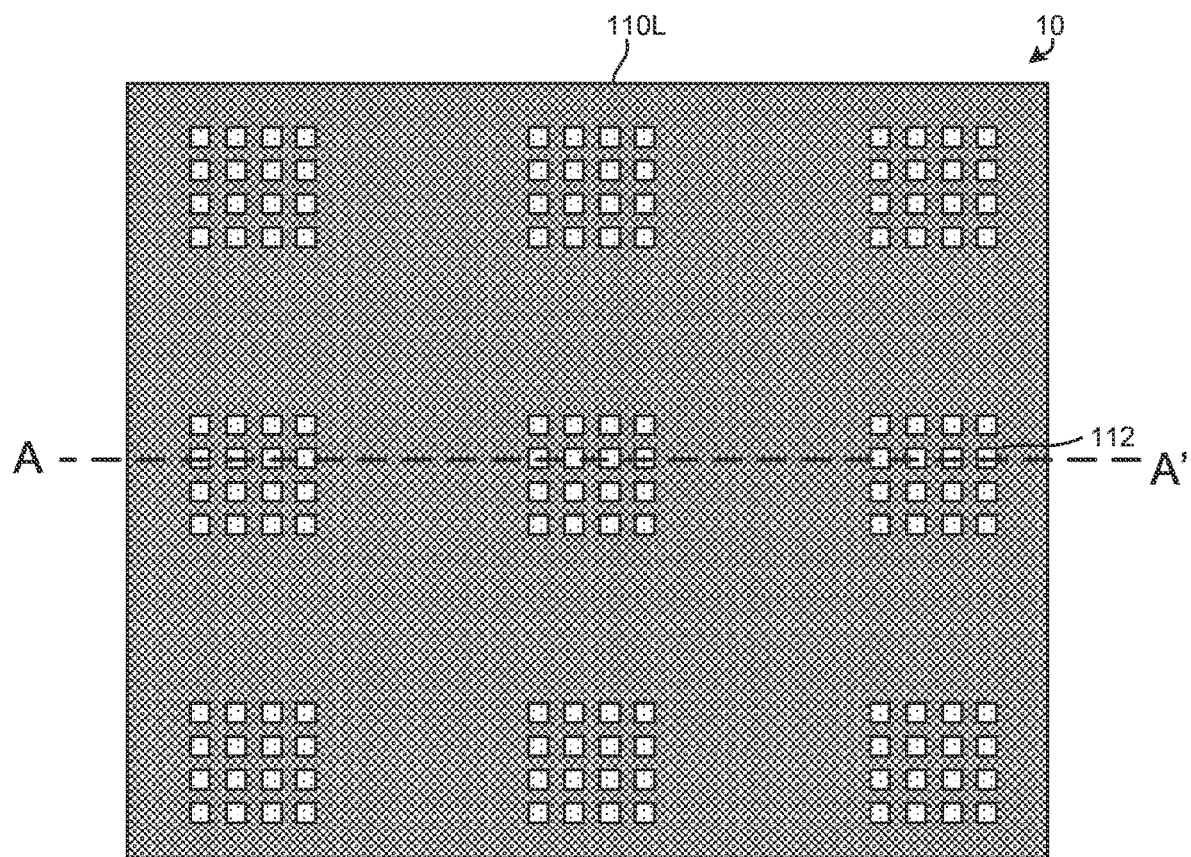
FIG. 6B is a top-down perspective view illustrating a step of etching hard mask portions 112 in a semiconductor die 10 in a method for fabricating an MFM capacitor in accordance with some embodiments of the present disclosure.

FIG. 6A is a vertical cross-sectional view through vertical plane AA' of FIG. 6B illustrating a step of etching hard mask portions 112 in a semiconductor die 10 in a method for fabricating an MFM capacitor in accordance with some embodiments of the present disclosure. FIG. 6B is a top-down perspective view illustrating a step of etching hard mask portions 112 in a semiconductor die 10 in a method for fabricating an MFM capacitor in accordance with some embodiments of the present disclosure. The dashed line illustrated in FIG. 6B indicates a cross-sectional cut of the semiconductor die 10 representing the vertical cross-section view as shown in FIG. 6A.

In various embodiments, an etching process may be used to transfer the pattern of the photoresist layer 114 onto the second pre-etching layer 112L to form hard mask portions 112. The etching process may remove portions of the photoresist layer 114 and unmasked portions of the second pre-etching layer 112L. The material of the second pre-etching layer 112L may be selective to the material of the photoresist layer 114, such that the photoresist layer 114 and unmasked portions of the second pre-etching layer 112L may be removed. The material of the first pre-etching layer 110L may be resistive to the etching process used to form the hard mask portions 112, such that the first pre-etching layer 110L is not removed or patterned during the etching process implementing to form the hard mask portions 112. The patterned hard mask portions 112 may serve to mask portions of the first pre-etching layer 110L that may be used as a hard mask in the formation of middle metal contacts formed from the middle metal contact layer 108L during a subsequent ion beam etching process (see FIG. 8A, 8B description below). In various embodiments, the second pre-etching layer 112L may be patterned to produce hard mask portions having a width of 25 nm to 100 nm, such as 50 to 80 nm, although greater or lesser thicknesses may be used. For example, the width 117 of a hard mask portion 112 may be 50 to 80 nm.

Figure 7A:
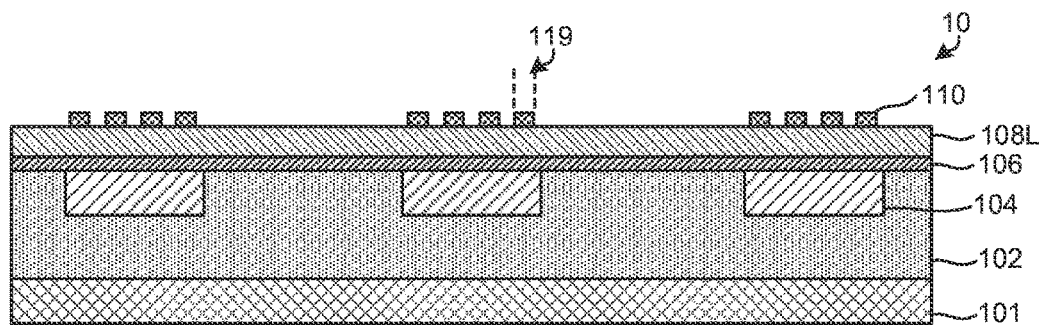
FIG. 7A is a vertical cross-sectional view of the first exemplary structure through vertical plane AA' of FIG. 7B illustrating a step of etching hard mask portions 110 in a semiconductor die 10 in a method for fabricating an MFM capacitor in accordance with some embodiments of the present disclosure.
Figure 7B:
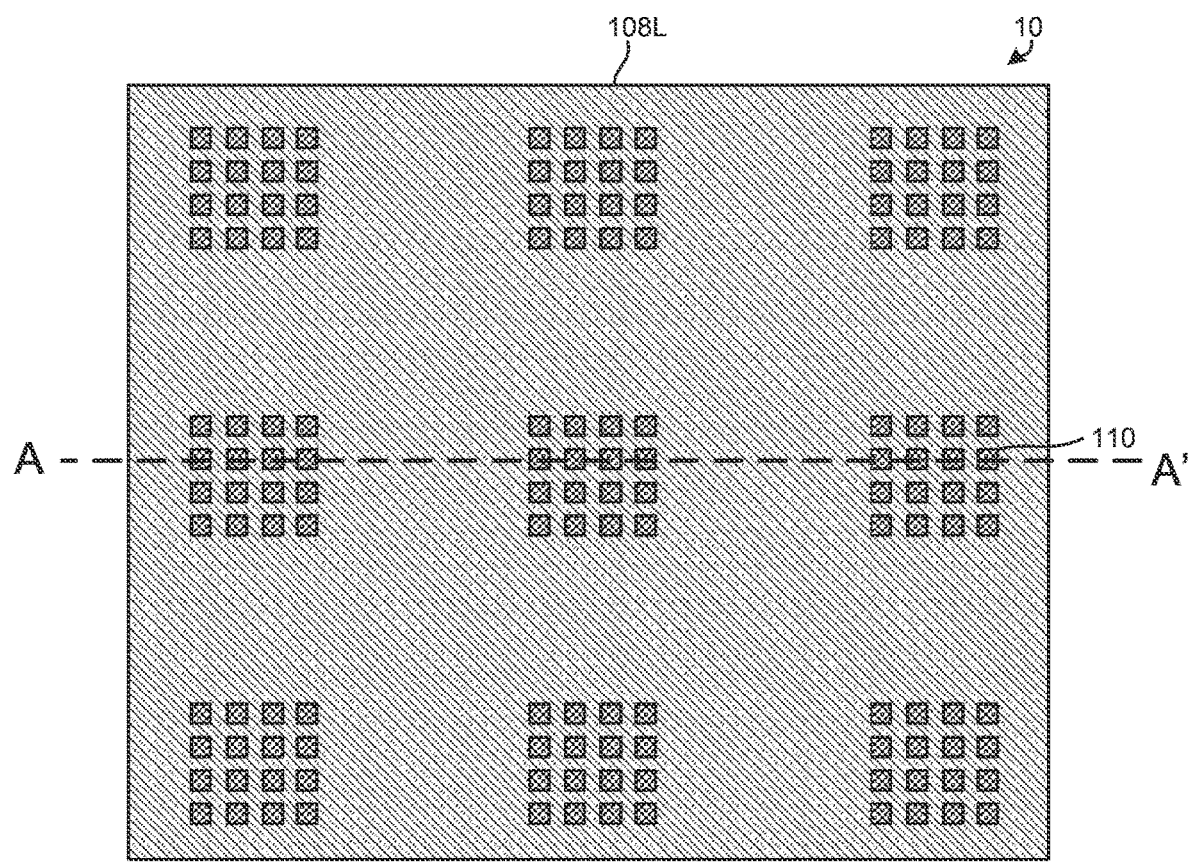
FIG. 7B is a top-down perspective view illustrating a step of etching hard mask portions 110 in a semiconductor die 10 in a method for fabricating an MFM capacitor in accordance with some embodiments of the present disclosure.

FIG. 7A is a vertical cross-sectional view through vertical plane AA' of FIG. 7B illustrating a step of etching hard mask portions 110 in a semiconductor die 10 in a method for fabricating an MFM capacitor in accordance with some embodiments of the present disclosure. FIG. 7B is a top-down perspective view illustrating a step of etching hard mask portions 110 in a semiconductor die 10 in a method for fabricating an MFM capacitor in accordance with some embodiments of the present disclosure. The dashed line illustrated in FIG. 7B indicates a cross-sectional cut of the semiconductor die 10 representing the vertical cross-section view as shown in FIG. 7A.

In various embodiments, an etching process may be used to transfer the pattern of the hard mask portions 112 onto the first pre-etching layer 110L to form hard mask portions 110. The etching process may remove the hard mask portions 112 and unmasked portions of the first pre-etching layer 110L. The material of the first pre-etching layer 110L may be selective to the material of the hard mask portions 112, such that the hard mask portions 112 and unmasked portions of the first pre-etching layer 110L may be removed. The material of the middle metal contact layer 108L may be resistive to the etching process used to form the hard mask portions 110, such that the middle metal contact layer 108L is not removed or patterned during the etching process implementing to form the hard mask portions 110. The patterned hard mask portions 110 may serve to mask portions of the middle metal contact layer 108L in the formation of middle metal contacts during a subsequent ion beam etching process (see FIG. 8A, 8B description below). In various embodiments, the first pre-etching layer 110L may be patterned to produce hard mask portions having a width of 25 nm to 100 nm, such as 50 to 80 nm, although greater or lesser thicknesses may be used. For example, the width 119 of a hard mask portion 110 may be 50 to 80 nm.

In some embodiments, a single pre-etching layer may be used as a hard mask instead of implementing the first pre-etching layer 110L and second pre-etching layer 112L. For example, a single pre-etching layer may be patterned by the photoresist layer 114, and the patterned portions of the single pre-etching layer may be subsequently used as a hard mask during an ion beam etching process to form middle metal contacts from the middle metal contact layer 108L. The single pre-etching layer may be comprised of a material that is selective to the photoresist layer 114, such that a reactive ion etching process used to form hard mask portions may remove the photoresist layer 114 and unmasked portions of the single pre-etching layer. The single pre-etching layer may also be comprised of a material that is selective to the middle metal contact layer 108L, such that an ion beam etching process used to form middle metal contacts from the middle metal contact layer 108L may remove the hard mask portions and unmasked portions of the middle metal contact layer 108L.

Figure 8A:
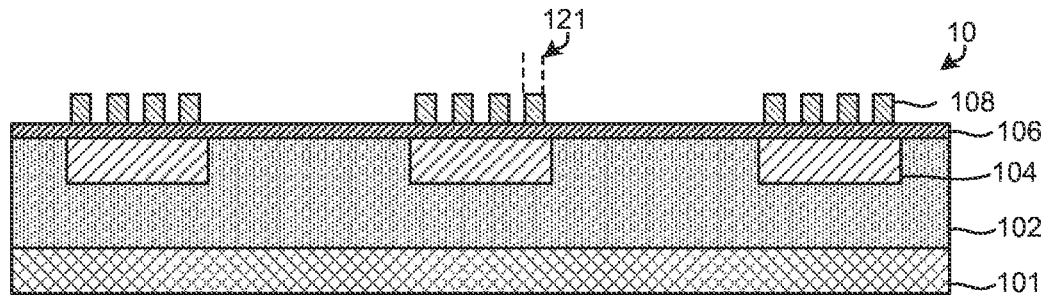
FIG. 8A is a vertical cross-sectional view of the first exemplary structure through vertical plane AA' of FIG. 8B illustrating a step of performing ion beam etching in a semiconductor die 10 in a method for fabricating an MFM capacitor in accordance with some embodiments of the present disclosure.
Figure 8B:
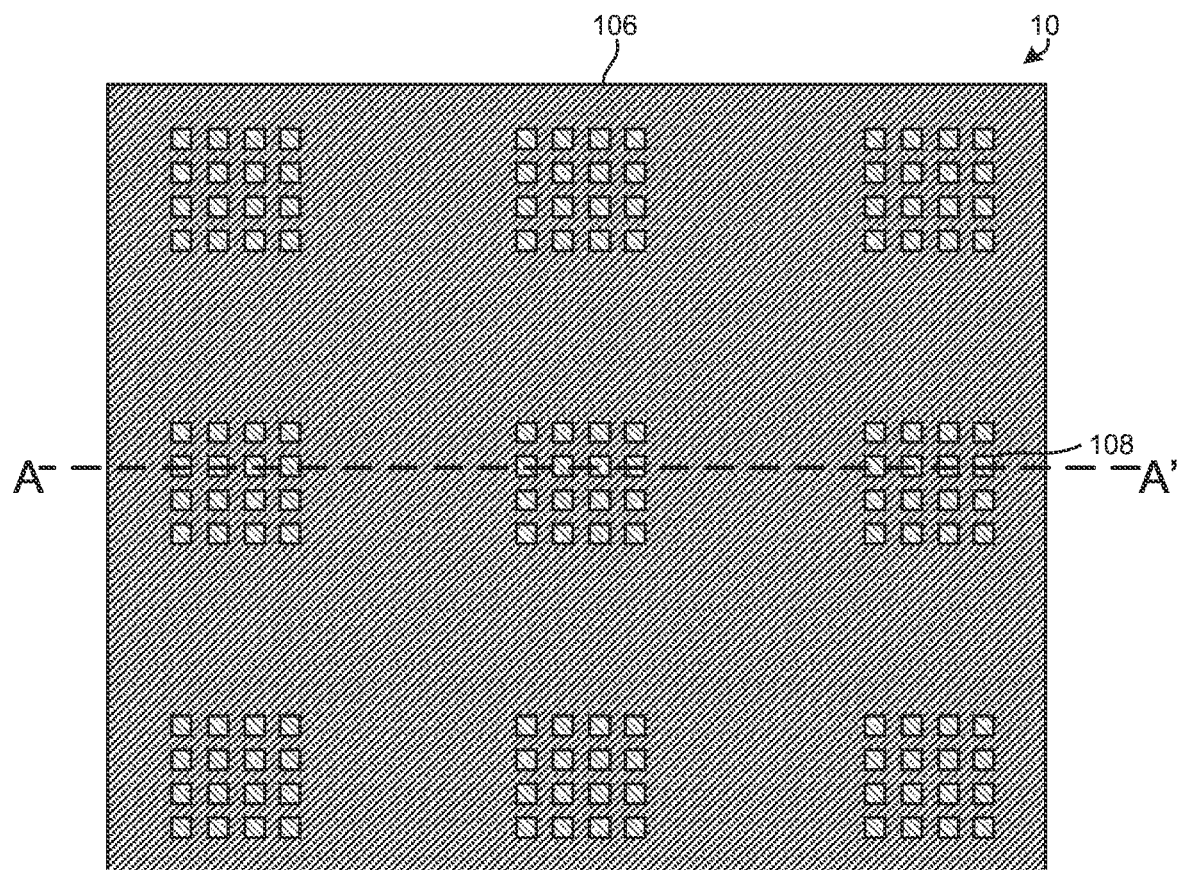
FIG. 8B is a top-down perspective view illustrating a step of performing ion beam etching in a semiconductor die 10 in a method for fabricating an MFM capacitor in accordance with some embodiments of the present disclosure.

FIG. 8A is a vertical cross-sectional view through vertical plane AA' of FIG. 8B illustrating a step of performing ion beam etching in a semiconductor die 10 in a method for fabricating an MFM capacitor in accordance with some embodiments of the present disclosure. FIG. 8B is a top-down perspective view illustrating a step of performing ion beam etching in a semiconductor die 10 in a method for fabricating an MFM capacitor in accordance with some embodiments of the present disclosure.

Referring to FIG. 8A, an array of metal contacts 108 may be formed as a result of performing ion beam etching on the middle metal contacts layer 108L and the hard mask portions 110. For example, as shown in FIG. 8A, the hard mask portions 110 have been etched away so that the FE blanket layer 106 may be exposed, and the array of a plurality of metal contacts 108 have been formed from the middle metal contact layer 108L corresponding to the dimensions of the hard mask portions 110. Thus, the array of metal contacts 108 may be patterned according to the pattern of the photoresist layer 114. For example, the dimensions of the array of metal contacts 108 may be patterned and have a width 121 based on a pattern of the photoresist layer 114 that is translated through one or more pre-etching layer (e.g., 110L, 112L) during one or more photolithography and etching processes with reference to FIGS. 5A through 7B as described.

Due to difficulty in creating a single etching process that is selective between the FE blanket layer 106 and the middle metal contact layer 108L, an additional etching, such as ion-beam etching or milling, may be implemented to pattern the middle metal contact layer 108L without etching away some or all of the FE blanket layer 106. Ion-beam etching may be implemented to form the array of metal contacts 108 by directing a beam of charged particles (ions) at a substrate with a suitably patterned mask (e.g., middle metal contact layer 108L) in a high vacuum chamber. Ion-beam etching enables highly-directional beams of neutral ions to control over the sidewall profile as well as radial uniformity optimization and feature shaping during nanopatterning. The focused ion beam etch process may use a focused beam of ions having energy in a range from 300 eV to 600 eV, although lesser and greater ion energies may also be used. The species of ions that may be used for the focused ion beam etch process include, but are not limited to, gallium, silicon, chromium, iron, cobalt, nickel, germanium, indium, tin, gold, and lead. In one embodiment, the focused ion beam etch process may include ions of a nonmagnetic element such as gallium. The focused ion beam may have a first angular spread in the propagation direction, which may be introduced, for example, by rastering. The first angular spread of the beam angle may be in a range from 0 degree to 30 degrees (as measured from a vertical direction that is perpendicular to the bottom surfaces of the hard mask portions 110).

Each metal contact within the array of metal contacts 108 may have a width of 25 nm to 100 nm, such as 50 to 80 nm, although greater or lesser thicknesses may be used. For example, the width 121 of one of the metal contacts of the array of metal contact 108 may be 50 to 80 nm corresponds to the width of the photoresist mask 114. The array of metal contacts 108 may be formed above the metal strips/portions of the bottom metal contact layer 104 with the FE blanket layer 106 disposed between the metal contacts.

Figure 9A:
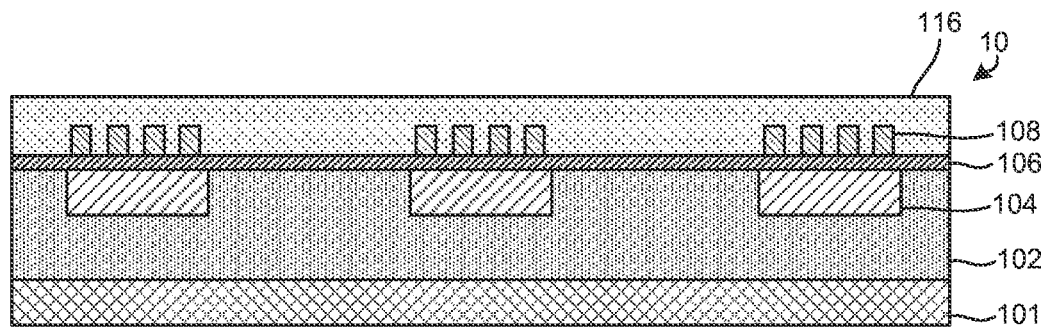
FIG. 9A is a vertical cross-sectional view of the first exemplary structure through vertical plane AA' of FIG. 9B illustrating a step of depositing a second passivation layer 116 in a semiconductor die 10 in a method for fabricating an MFM capacitor in accordance with some embodiments of the present disclosure.
Figure 9B:
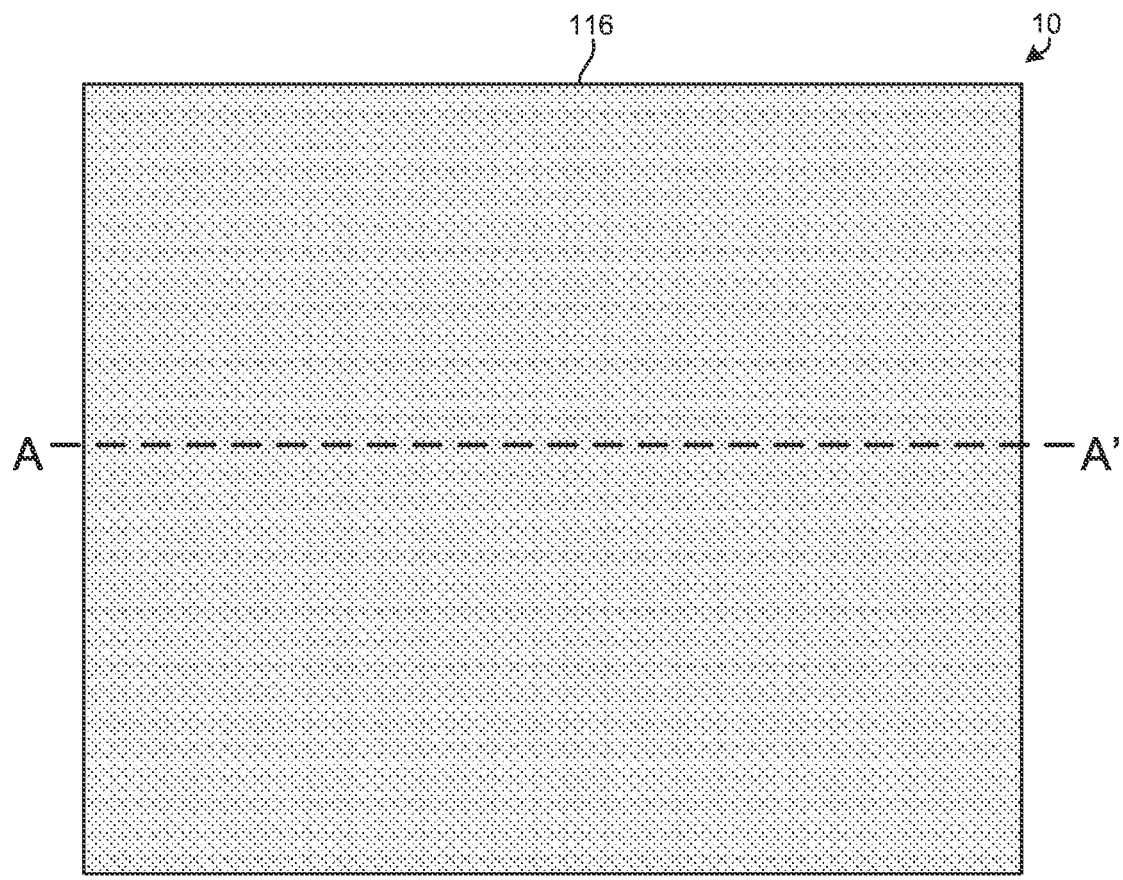
FIG. 9B is a top-down perspective view illustrating a step of depositing a second passivation layer 116 in a semiconductor die 10 in a method for fabricating an MFM capacitor in accordance with some embodiments of the present disclosure.

FIG. 9A is a vertical cross-sectional view through vertical plane AA' of FIG. 9B illustrating a step of depositing a second passivation layer 116 in a semiconductor die 10 in a method for fabricating an MFM capacitor in accordance with some embodiments of the present disclosure. FIG. 9B is a top-down perspective view illustrating a step of depositing a second passivation layer 116 in a semiconductor die 10 in a method for fabricating an MFM capacitor in accordance with some embodiments of the present disclosure.

Referring to FIG. 9A, a second passivation layer 116 may be deposited on top of the exposed portions of the FE blanket layer 106 and the array of metal contacts 108. The second passivation layer 116 may be made of $SiO_2$ or any material conventionally used for depositing a passivation layer. The second passivation layer 116 may be formed by any suitable method. For example, the materials for the various layers may be deposited by PVD, CVD, ALD, or any epitaxial deposition method.

Figure 10A:
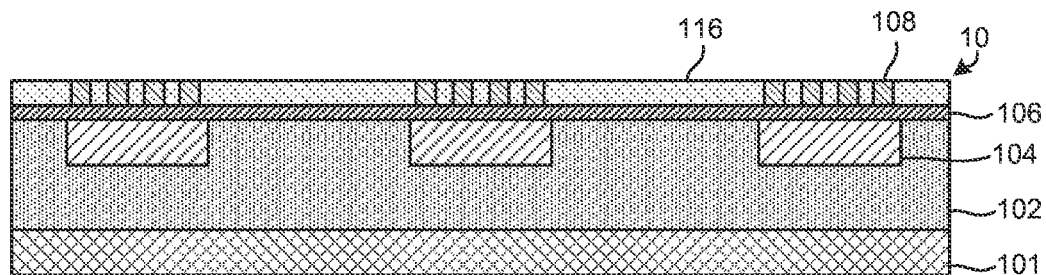
FIG. 10A is a vertical cross-sectional view of the first exemplary structure through vertical plane AA' of FIG. 10B illustrating a step of performing CMP in a semiconductor die 10 in a method for fabricating an MFM capacitor in accordance with some embodiments of the present disclosure.
Figure 10B:
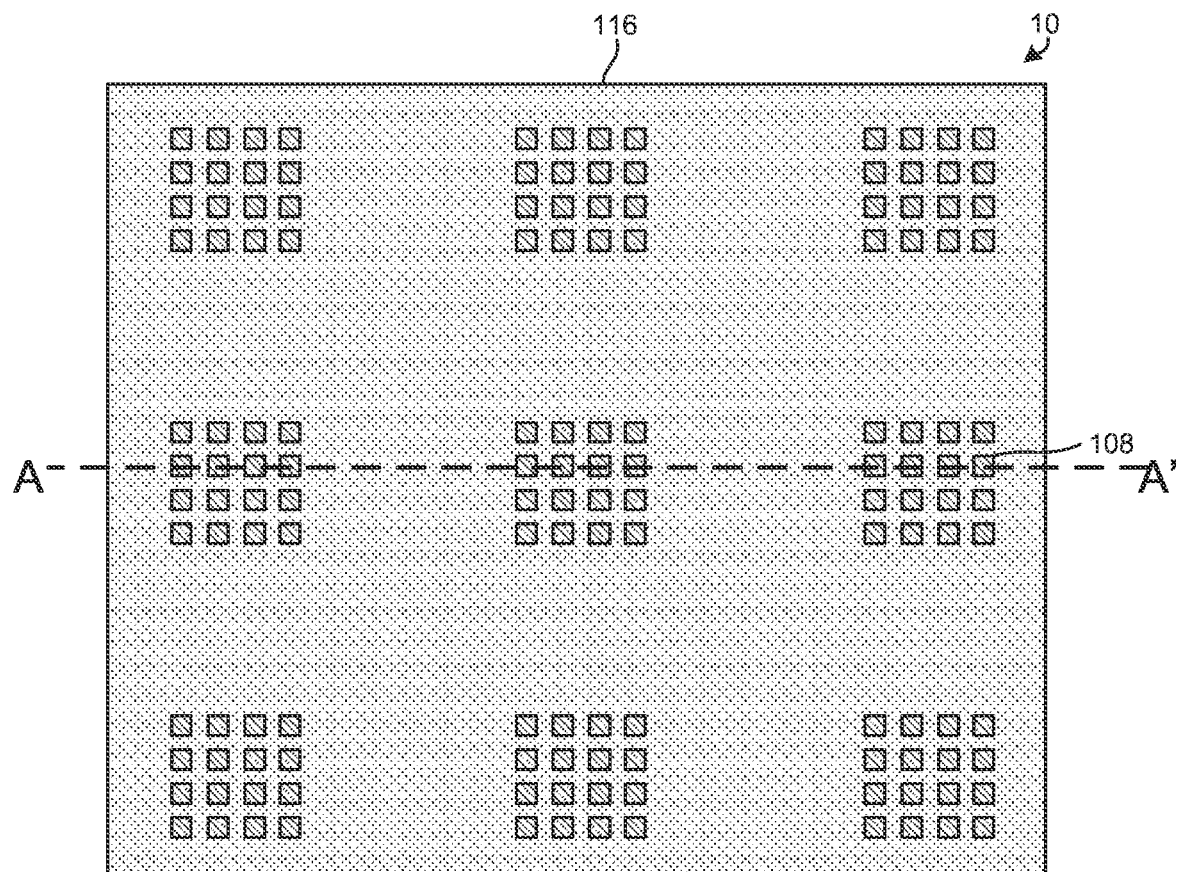
FIG. 10B is a top-down perspective view illustrating a step of performing CMP in a semiconductor die 10 in a method for fabricating an MFM capacitor in accordance with some embodiments of the present disclosure.

FIG. 10A is a vertical cross-sectional view through vertical plane AA' of FIG. 10B illustrating a step of performing CMP in a semiconductor die 10 in a method for fabricating an MFM capacitor in accordance with some embodiments of the present disclosure. FIG. 10B is a top-down perspective view illustrating a step of performing CMP in a semiconductor die 10 in a method for fabricating an MFM capacitor in accordance with some embodiments of the present disclosure. The dashed line illustrated in FIG. 10B indicates a cross-sectional cut of the semiconductor die 10 representing the vertical cross-section view as shown in FIG. 10A.

Referring to FIG. 10A, CMP may be performed to remove top portions of the second passivation layer 116 as well as portions of the array of metal contacts 108 such that the array of metal contacts 108 may be exposed and are co-planar with a top surface of the second passivation layer 116.

Figure 11A:
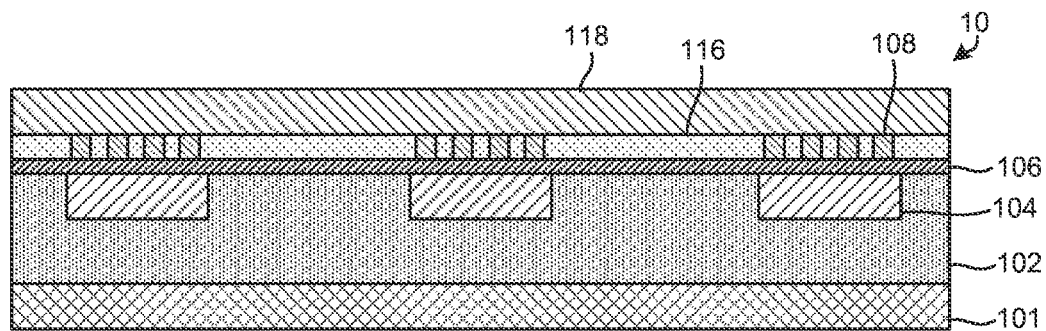
FIG. 11A is a vertical cross-sectional view of the first exemplary structure through vertical plane AA' of FIG. 11B illustrating a step of depositing a metal cross-bar structure 118 in a semiconductor die 10 in a method for fabricating an MFM capacitor in accordance with some embodiments of the present disclosure.
Figure 11B:
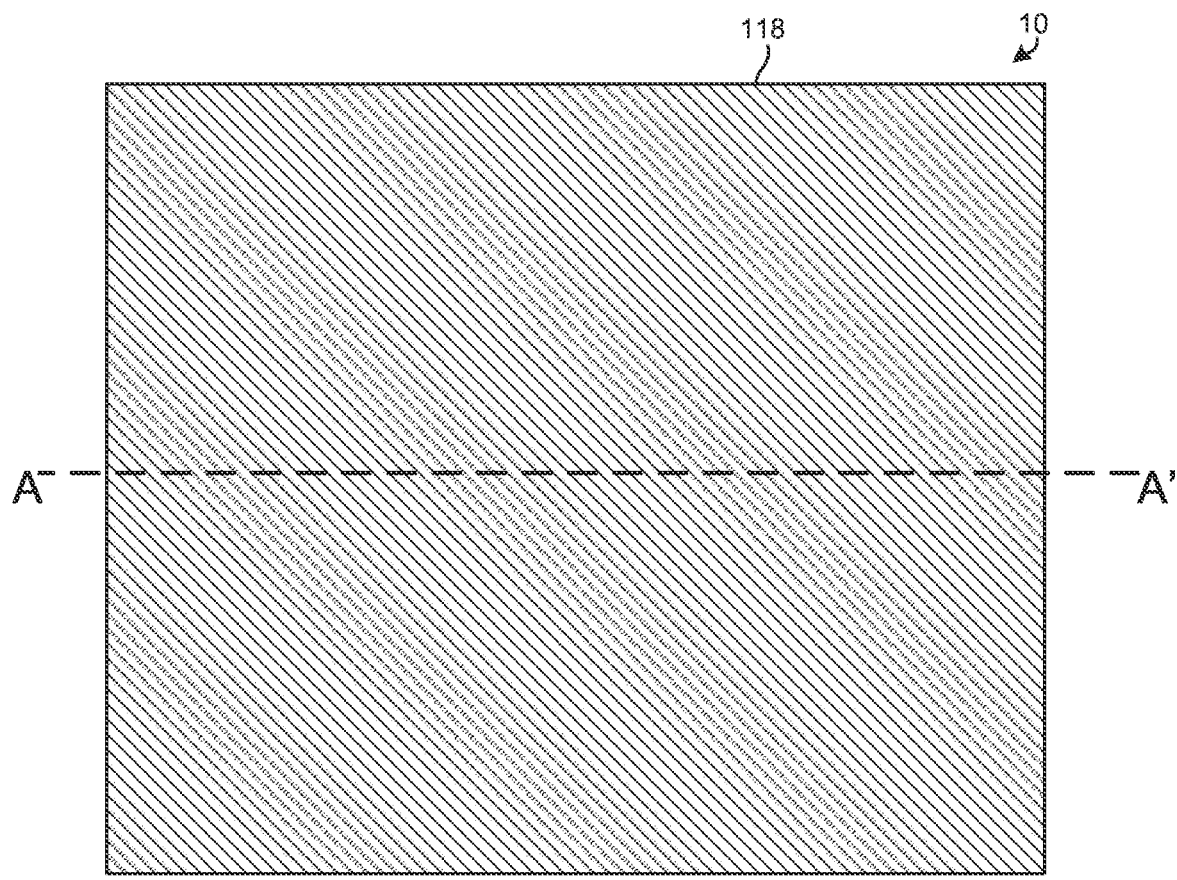
FIG. 11B is a top-down perspective view illustrating a step of depositing a metal cross-bar structure 118 in a semiconductor die 10 in a method for fabricating an MFM capacitor in accordance with some embodiments of the present disclosure.

FIG. 11A is a vertical cross-sectional view through vertical plane AA' of FIG. 11B illustrating a step of depositing a metal cross-bar structure in a semiconductor die 10 in a method for fabricating an MFM capacitor in accordance with some embodiments of the present disclosure. FIG. 11B is a top-down perspective view illustrating a step of depositing a metal cross-bar structure 118 in a semiconductor die 10 in a method for fabricating an MFM capacitor in accordance with some embodiments of the present disclosure.

Referring to FIG. 11A, a metal cross-bar structure 118 material layer may be deposited over the second passivation layer 116 and the array of metal contacts 108 such that the metal cross-bar structure 118 is in contact and therefore in electrical communication with the array of metal contacts 108. In various embodiments, the metal cross-bar structure 118 may be made of TiN, TaN, W, Ru, or Al. Other suitable materials for the metal cross-bar structure 118 are within the contemplated scope of disclosure. In various embodiments, the metal cross-bar structure 118 may be deposited using any known method, including PVD, CVD, and PECVD.

Figure 12A:
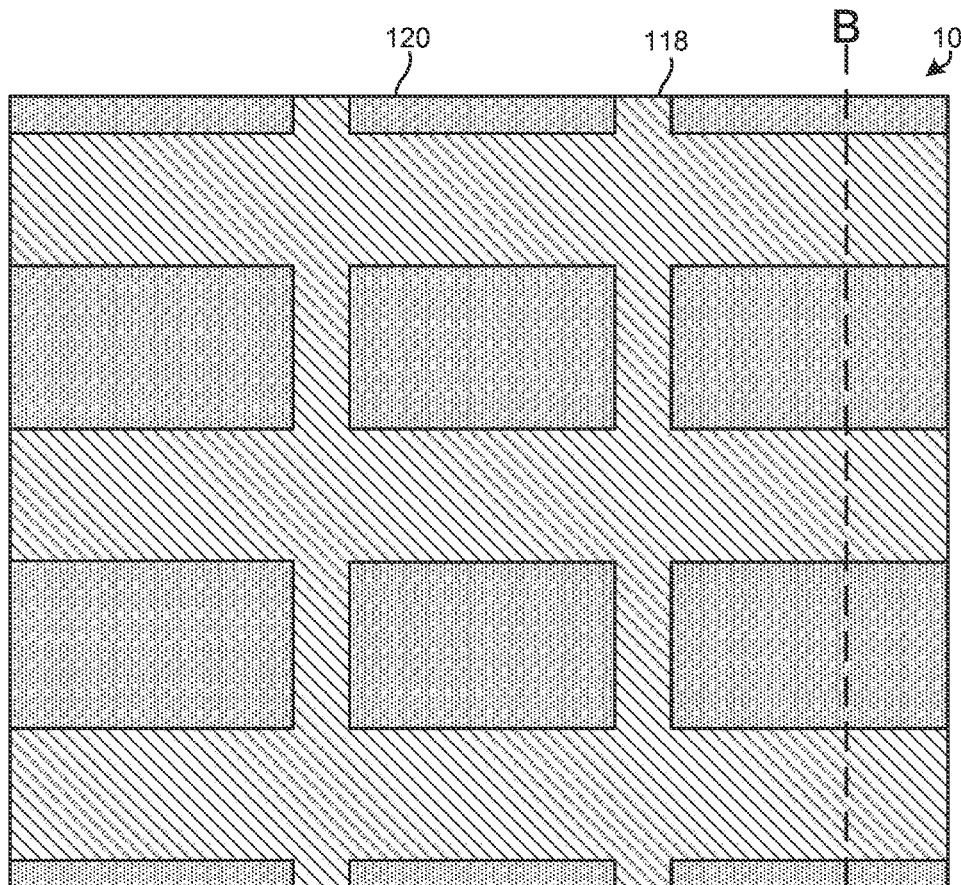
FIG. 12A is a top-down perspective view of the first exemplary structure through vertical plane BB' of FIG. 12B illustrating a step of depositing a third passivation layer 120 in a semiconductor die 10 in a method for fabricating an MFM capacitor in accordance with some embodiments of the present disclosure.
Figure 12B:
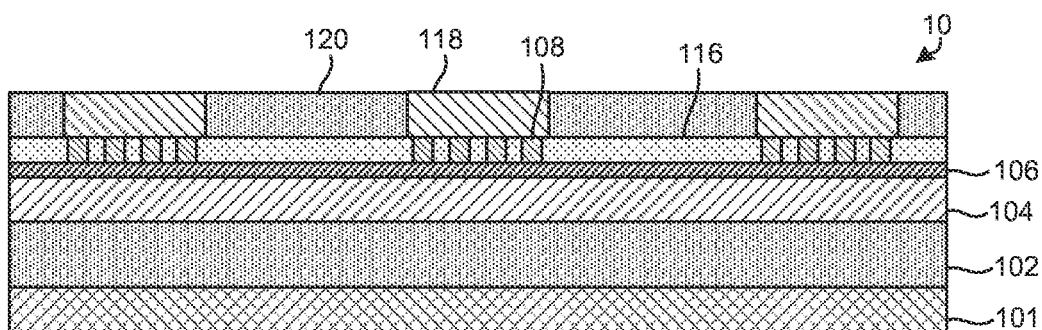
FIG. 12B is a vertical cross-sectional view illustrating a step of depositing a third passivation layer 120 in a semiconductor die 10 in a method for fabricating an MFM capacitor in accordance with some embodiments of the present disclosure.

FIG. 12A is a top-down perspective view illustrating a step of depositing a third passivation layer 120 in a semiconductor die 10 in a method for fabricating an MFM capacitor in accordance with some embodiments of the present disclosure. FIG. 12B is a vertical cross-sectional view through vertical plane BB' of FIG. 12A illustrating a step of depositing a third passivation layer 120 in a semiconductor die 10 in a method for fabricating an MFM capacitor in accordance with some embodiments of the present disclosure.

A photoresist material (not shown) may be deposited over the metal cross bar structure 118 material layer and patterned through a photolithographic process. The patterned photoresist material may mask the metal cross bar structure 118 to form as a lattice structure having metal portions, or strips, running in directions perpendicular and parallel to the directions of the layout of the metal strips (i.e. bottom metal contacts) within the bottom metal layer 104. For example, one or more metal strips (i.e. top metal contacts) of the metal cross-bar structure 118 may be oriented in a first direction different from a direction of one or more metal strips in the bottom metal layer 104, and the array of metal contacts 108 may be formed to be within intersection regions where the metal cross-bar structure 118 overlaps with the metal strips of the bottom metal layer 104. The portions of the metal cross bar structure 118 material layer remaining exposed by the patterned photoresist material may be subsequently etched to form cavities between the lattice structure that expose the top surface of the second passivation layer 116. The photoresist material may be removed, for example, by ashing.

Referring to FIG. 12A, a third passivation layer 120 may be deposited over the metal cross-bar structure 118 and exposed portions of the second passivation layer 116 to fill in the cavities formed after the etch process. The third passivation layer 120 may be deposited in cavities, or "pockets," formed by the lattice structure of the metal cross-bar structure 118. In other embodiments, the third passivation layer 120 may be deposited on top of the metal cross-bar structure 118 and the exposed portions of the second passivation layer 116. The metal cross-bar structure 118 and the third passivation layer 120 may be planarized, for example, by a CMP step to render the metal cross-bar structure 118 and the third passivation layer 120 co-planar. The third passivation layer 120 may be made of $SiO_2$ or any material conventionally used for depositing a passivation layer. Other suitable passivation materials are within the contemplated scope of disclosure. The third passivation layer 120 may be formed by any suitable method. For example, the materials for the various layers may be deposited by PVD, CVD, ALD, or any epitaxial deposition method.

Figure 13:
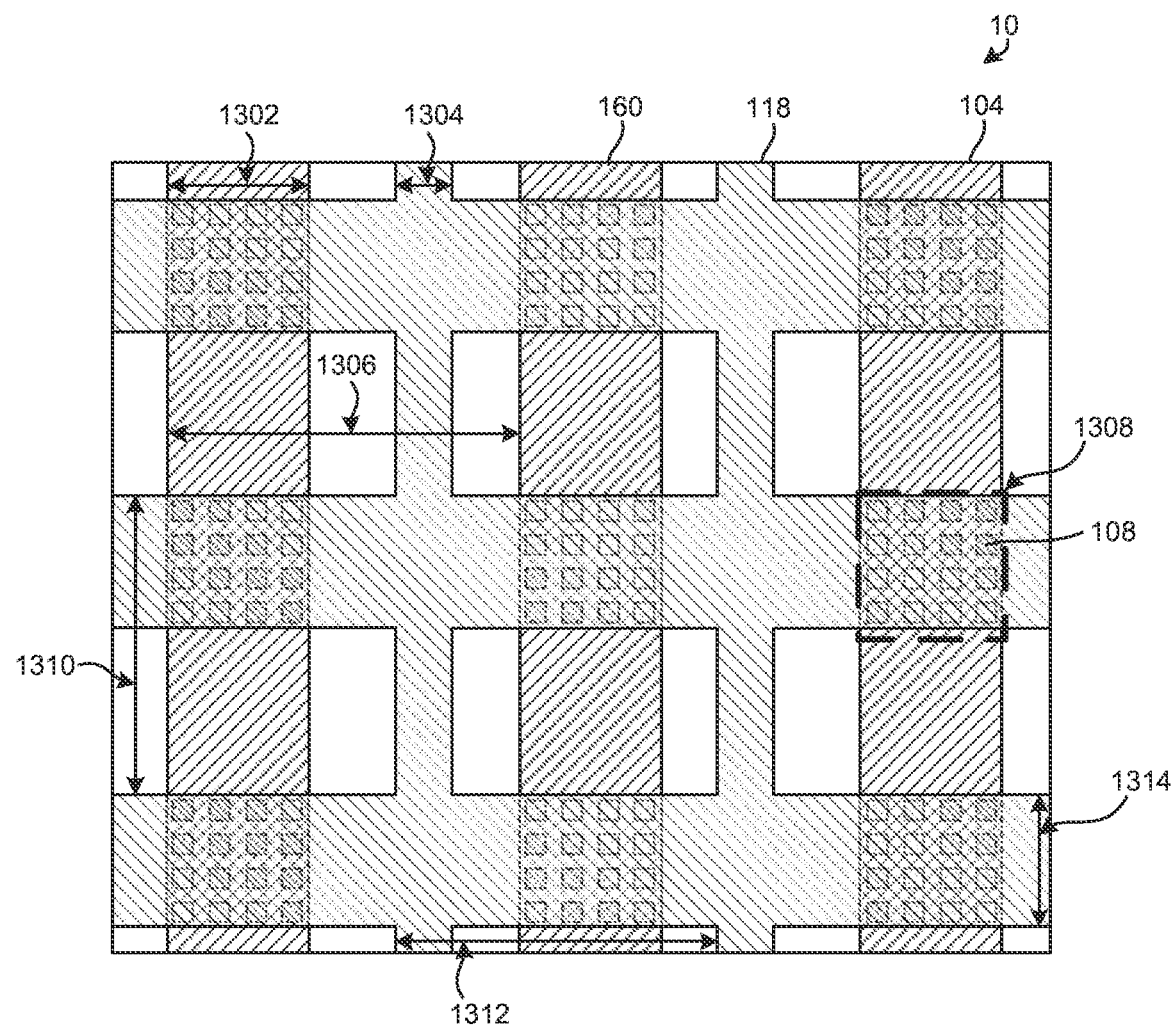
FIG. 13 illustrates a top-down perspective view illustrating an array of metal contacts in a semiconductor die 10 in a method for fabricating an MFM capacitor in accordance with some embodiments.

FIG. 13 illustrates a top-down perspective view illustrating an array of metal contacts in a semiconductor die 10 in a method for fabricating an MFM capacitor in accordance with some embodiments. For ease of illustration, layers including metal material of the semiconductor die 10 are shown, and other various layers such as passivation layers are not shown. The metal cross-bar structure 118 is illustrated as semi-transparent to showcase intersection regions 1308 with the bottom metal contact layer 104. Referring to FIG. 13, a plurality of arrays of middle metal contacts 108 may be positioned throughout a semiconductor layout between the metal cross-bar structure 118 and the bottom metal contact layer 104. The bottom metal contact layer 104 may have one or more metal strips, or bottom metal contacts, extending in a direction different from or perpendicular to one or more metal strips, or top metal contacts, of the metal cross-bar structure 118. Metal strips of the metal cross-bar structure 118 may overlap the one or more metal strips of the bottom metal contact layer 104, such that the vertical intersection of the metal strips in the bottom metal contact layer 104 and the metal cross-bar structure 118 form intersection regions 1308 of a certain area. The semiconductor die 10 may include a plurality of intersection regions 1308. For example, FIG. 13 illustrates a portion of a semiconductor device 10, and any number of arrays greater than or less than the nine instances of intersection regions 1308 shown in FIG. 13 may be formed on a semiconductor die 10. As the intersection regions 1308 may be formed at the intersection of the bottom metal contact layer 104 and the metal cross-bar structure 118, the semiconductor die 10 effectively includes a two-dimensional array of intersection regions 1308. Each of the intersection regions 1308 may include an array of middle metal contacts 108. For example, as shown in FIG. 13, the array of middle metal contacts 108 may include a 4×4 array of middle metal contacts 108. Similarly, three metal strips/bottom metal contacts of the bottom metal contact layer 104 are illustrated in FIG. 13, but any number of metal strips may be formed within a semiconductor die 10. Thus, the semiconductor device 10 may include a plurality of arrays of middle metal contacts 108, wherein each of the plurality of arrays of middle metal contacts 108 may be formed in an intersection region 1308.

In various embodiments, the metal strips of the bottom metal contact layer 104 and the metal cross-bar structure 118 may have varying dimensions depending on the application and the desired photovoltaic characteristics of the MFM capacitors formed within the semiconductor die 10. Metal portions/strips of the bottom metal contact layer 104 may have a width (e.g., width 1302) within a range of 600-1200 nm, although lesser or greater widths may be used. For example, the metal portions/strips of bottom metal contact layer 104 may have a width of 800 nm.

Metal portions/strips of the metal cross-bar structure 118 extending in a direction the same as the direction of the metal strips of the bottom metal contact layer 104 may have a width (e.g., width 1304) within a range of 300-700 nm, although lesser or greater widths may be used. For example, the metal portions/strips of the metal cross-bar structure 118 extending in the same direction as the direction of the metal strips of the bottom metal contact layer 104 may have a width of 500 nm.

An edge of a first metal strip of the bottom metal contact layer 104 may be separated from an edge of an adjacent metal strip of the bottom metal contact layer 104 by a distance (distance 1306) of 1500-2500 nm, although lesser or greater separation distance may be used. For example, the edge of a first metal strip of the bottom metal contact layer 104 may be separated from an edge of an adjacent metal strip of the bottom metal contact layer 104 by a distance of 2000 nm.

An edge of a first metal portion/strip of the metal cross-bar structure 118 may be separated from an edge of an adjacent metal portion/strip of the metal cross-bar structure 118 by a distance (distance 1310) of 1000-2200 nm, although lesser or greater separation distance may be used. For example, the edge of a first metal portion/strip of the metal cross-bar structure 118 may be separated from an edge of an adjacent metal portion/strip of the metal cross-bar structure 118 by a distance of 1600 nm.

An edge of a second metal portion/strip (i.e. cross-bar portion extending in a direction the same as the direction of the metal strips of the bottom metal contact layer 104) of the metal cross-bar structure 118 may be separated from an edge of an adjacent metal portion/strip of the metal cross-bar structure 118 by a distance (distance 1312) of 1500-2500 nm, although lesser or greater separation distance may be used. For example, the edge of a second metal portion/strip of the metal cross-bar structure 118 may be separated from an edge of an adjacent metal portion/strip of the metal cross-bar structure 118 by a distance of 2000 nm.

Metal portions/strips of the metal cross-bar structure 118 extending in a direction different from the direction of the metal strips of the bottom metal contact layer 104 may have a width (e.g., width 1314) within a range of 600-1200 nm, although lesser or greater widths may be used. For example, the metal portions/strips of the metal cross-bar structure 118 extending in a direction different from the direction of the metal strips of the bottom metal contact layer 104 may have a width of 800 nm.

In various embodiments, the metal cross-bar structure 118 may have metal portions/strips extending in the same direction that the metal strips of the bottom metal contact layer 104 are extending. In various embodiments, the metal strips of the metal cross-bar structure 118 may be patterned to run in a direction parallel to the metal strips of the bottom metal contact layer 104, therefore forming multiple MFM capacitors. Each of the formed MFM capacitors may have a plate length equal to the width of the bottom metal contact layer 104 strips and the metal strips of the metal cross-bar structure 118, such that the array of metal contacts 108 may be positioned between the bottom metal contact layer 104 strips and the metal cross-bar structure 118. Each of the top metal strips of the metal cross-bar structure 118 may have a width between 100 and 300 nm. For example, a metal portion of the metal cross-bar structure 118 at the intersection region may have a width of 200 nm, although narrower or wider widths may be used. Each of the metal strips of the metal cross-bar structure 118 may be separated from adjacent metal strips by a distance of 150-250 nm, although lesser or greater separation distance may be used. For example, the parallel metal strips of the metal cross-bar structure 118 may have a separation distance of 200 nm between each of the metal strips.

Figure 14:
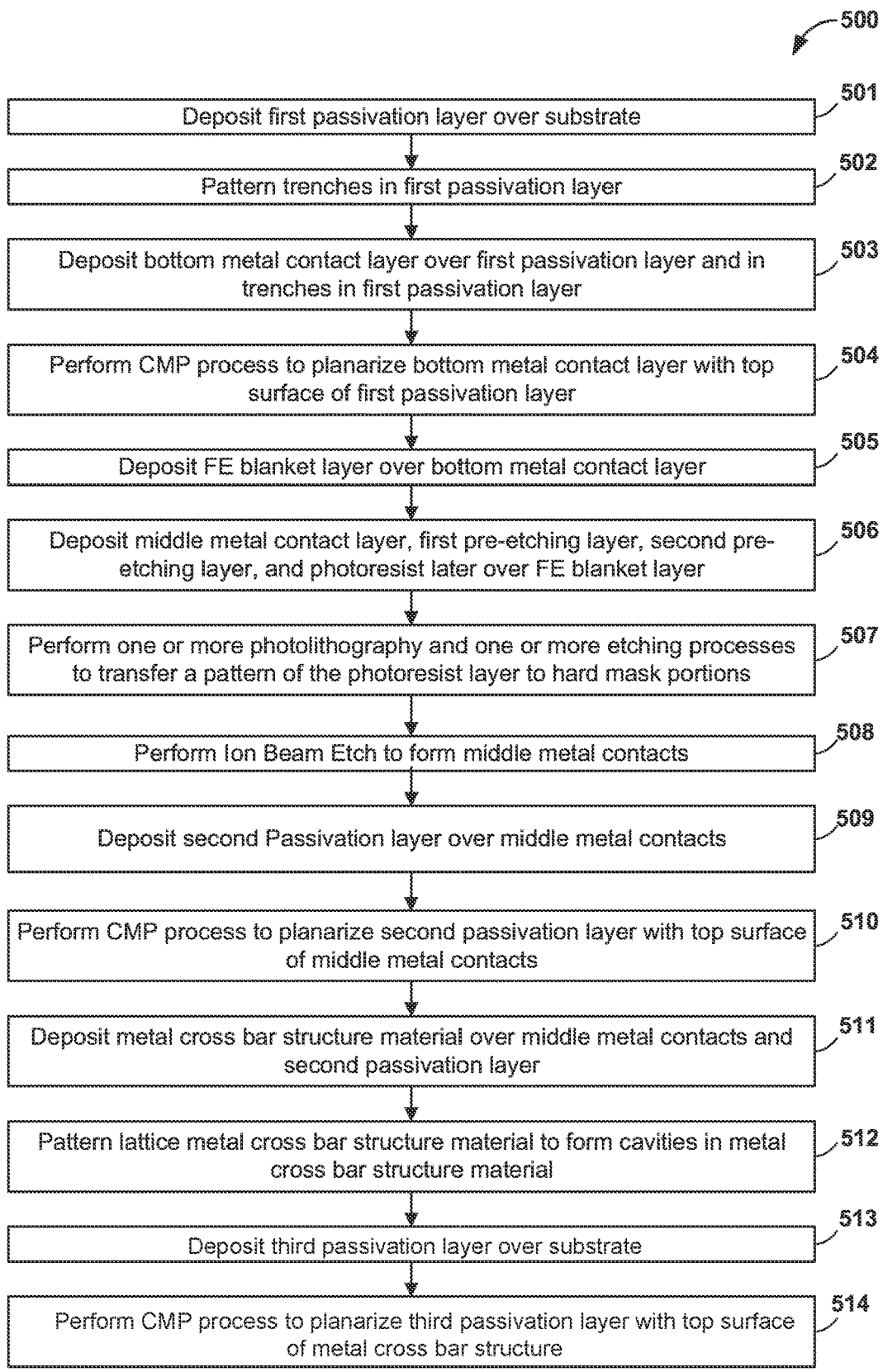
FIG. 14 is a flowchart illustrating a method of making an array of MFM capacitor devices in accordance with various embodiments of the present disclosure.

FIG. 14 is a flowchart illustrating general method 500 of forming a metal-ferroelectric-metal capacitor array device 100 having a small ferroelectric area measurement area according to various embodiments. Referring to step 501, the method includes depositing a first passivation layer 102 over a substrate 101. Referring to step 502, the method includes patterning the first passivation layer 102 to form trenches in the first passivation layer 102. Referring to step 503, the method includes depositing a bottom metal contact 104 material over the first passivation layer 102 and in the patterned trenches. Referring to step 504, the method includes performing a CMP process to planarize the bottom metal contact 104 material and the first passivation layer 102 to form a co-planar top surface of both the bottom metal contact 104 and the first passivation layer 102. Referring to step 505, the method includes depositing a FE blanket layer 106 over the bottom metal contact 104 layer and the first passivation layer 102. Referring to step 506, the method includes depositing a middle metal contact layer 108L over the FE blanket layer 106, depositing a first and second pre-etching layer 110L, 112L over the middle metal contact layer 108L, and depositing a photoresist layer 114 over the first and second pre-etching layer 110L, 112L. Referring to step 507, the method includes performing one or more photolithography and one or more etching processes to transfer a pattern of the photoresist layer 114 to hard mask portions 110, 112 formed from the first and second pre-etching layer 110L, 112L. Referring to step 508, the method includes performing an ion beam etch process to form an array of a plurality of middle metal contacts 108, in which the array of the plurality of middle metal contacts 108 are based on the dimensions of the hard mask portions 110, 112. Referring to step 509, the method includes depositing a second passivation layer 116 over the middle metal contact layer 108L and the FE blanket layer 106. Referring to step 510, the method includes performing a CMP process to planarize the second passivation layer 116 and the middle metal contacts 108 to form a co-planar top surface of both the middle metal contact 108 and the second passivation layer 116. Referring to step 511, the method includes depositing a metal cross-bar structure material 118 over the second passivation layer 116 and the first passivation layer 102. Referring to step 512, the method includes patterning the metal cross-bar structure layer 118 to form a lattice metal cross-bar structure with cavities in the metal cross-bar structure layer 118 to expose the second passivation layer 116. Referring to step 513, the method includes depositing a third passivation layer 120 over the metal cross-bar structure layer 118 lattice and the second passivation layer 116. Referring to step 514, the method includes performing a CMP process to planarize the third passivation layer 120 and the metal cross-bar structure layer 118 lattice to form a co-planar top surface of both the metal cross-bar structure layer 118 lattice and the third passivation layer 120.

Referring to all drawings and according to various embodiments of the present disclosure, a ferroelectric MFM capacitor formed on a semiconductor die 10 is provided, which comprises a bottom metal contact 104 disposed on a substrate 101 and extending in a first direction, a ferroelectric blanket layer 106 disposed on the bottom metal contact 104, a cross-bar structure 118 disposed on the ferroelectric blanket layer 106 and extending in a second direction different from the first direction, and an array of a plurality of middle metal contacts 108 disposed between the bottom metal contact 104 and the cross-bar structure 118 and located within an intersection region 1308 of the bottom metal contact 104 and the cross-bar structure 118. In one embodiment, each of the middle metal contacts within the array of the plurality of middle metal contacts 108 may have a width of 50-80 nanometers. In one embodiment, the cross-bar structure 118 may comprise a plurality of metal strips forming the metal cross-bar structure 118, the metal cross-bar structure 118 may include one or more metal strips extending in the first direction, and the one or more metal strips may be in contact with a second metal strip to form a lattice. In one embodiment, the array of the plurality of middle metal contacts 108 may be formed using ion beam etching. In one embodiment, the second metal strip may be a portion of a cross-bar structure 118 having a third metal strip extending in a same direction as the first direction. In one embodiment, the intersection region 1308 may be an area of 800 nanometers by 800 nanometers. In one embodiment, the ferroelectric blanket layer 106 may be made of one of HfZrO, HfAlO, HfLaO, HfCeO, HfO, HfGdO, or HfSiO. In one embodiment, the ferroelectric blanket layer 106 may be deposited using one of PVD, PECVD, ALD, or PEALD. In one embodiment, the bottom metal contact 104 and the cross-bar structure 118 may be made of one of TiN, TaN, W, Ru, or Al. In one embodiment, the bottom metal contact 104 and the cross-bar structure 118 may be deposited using one of PVD, CVD, or PECVD.

Referring to all drawings and according to various embodiments of the present disclosure, a ferroelectric MFM capacitor structure formed on a semiconductor die 10 is provided, which comprises a bottom metal contact 104, disposed on a substrate 101 and extending in a first direction, a ferroelectric blanket layer 106 disposed on the bottom metal contact 104, a cross-bar structure 118 disposed on the ferroelectric blanket layer 106, in which the cross-bar structure 118 is a lattice having metal portions extending in the first direction and metal portions extending in a second direction different from the first direction, a passivation layer 120 disposed between the metal portions extending in the first direction and the metal portions extending in the second direction, a plurality of arrays of middle metal contacts 108 disposed between the bottom metal contact 104 and the cross-bar structure 118, wherein each array of middle metal contacts 108 is located within respective intersection regions 1308 of the bottom metal contact 104 and the cross-bar structure 118.

The combination of bottom metal strip, FE blanket layer, and top metal strips with metal contacts may form an array structure creating an MFM capacitor. In this manner, the various embodiment array structures disclosed herein may enable measurement of signals from small ferroelectric material portions (e.g., smaller than 5 μm by 5 μm) by increasing the magnitude of the total measurement current above the measurement threshold, i.e., by increasing the measured current so as to mitigate against the noise switching current. Thus, the MFM array structure of the present disclosure may overcome measurement noise introduced by various parasitic effects of the ferroelectric device. In other words, various embodiments allow for the fabrication and implementation of a plurality of small FE areas (e.g., 50 nm by 50 nm) to form an MFM capacitor array with a total area sufficiently large enough (e.g., 1 μm by 1 μm) to maintain sufficient current flow. The total area of the MFM capacitor array comprising small FE areas can allow for sufficient current flow while reducing the switching current noise across each small FE area within the MFM capacitor array. The small FE area (e.g. 50 nm by 50 nm) is defined by small metal top-electrodes, in which each small metal-top electrode within the array are connected using a cross-bar structure to form the MFM capacitor. With switching current noise reduced, extremely small FE area signals may be measured at each small FE area to characterize intrinsic FE properties such as Pr, Ec, data retention, and write endurance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a ferroelectric metal-ferroelectric metal (MFM) capacitor on a semiconductor die comprising:
    depositing a first passivation layer over a substrate;
    patterning the first passivation layer to form trenches in the first passivation layer;
    depositing a bottom metal contact material over the first passivation layer and in the patterned trenches to form bottom metal contacts;
    performing a CMP process to planarize the bottom metal contact material and the first passivation layer to form a co-planar top surface of both the bottom metal contacts and the first passivation layer;
    depositing a ferroelectric (FE) blanket layer over the bottom metal contacts and the first passivation layer;
    depositing a middle metal contact layer over the FE blanket layer;
    depositing a first pre-etch layer and a second pre-etch layer over the middle metal contact layer;
    performing an ion beam etch process to form an array of a plurality of middle metal contacts;
    depositing a second passivation layer over the array of the plurality of middle metal contacts and the FE blanket layer;
    performing a CMP process to planarize the second passivation layer and the array of the plurality of middle metal contacts to form a co-planar top surface of both the plurality of middle metal contacts and the second passivation layer;
    depositing a metal cross-bar structure material over the second passivation layer and the first passivation layer;
    patterning the metal cross-bar structure material to form a lattice metal cross-bar structure with cavities in the metal cross-bar structure layer to expose the second passivation layer;
    depositing a third passivation layer over the metal cross-bar structure material lattice and the second passivation layer; and
    performing a CMP process to planarize the third passivation layer and the metal cross-bar structure material lattice to form a co-planar top surface of both the metal cross-bar structure lattice and the third passivation layer.

2. The method of claim 1, wherein the array of the plurality of middle metal contacts is disposed between the bottom metal contacts and the metal cross-bar structure and located within an intersection region of the bottom metal contacts and the metal cross-bar structure.

3. The method of claim 2, wherein the intersection region is an area of 800 nanometers by 800 nanometers.

4. The method of claim 1, wherein each middle metal contact within array of the plurality of middle metal contacts has a width of 50-80 nanometers.

5. The method of claim 1, wherein the array of the plurality of middle metal contacts is disposed using ion beam etching.

6. The method of claim 1, wherein a second metal strip is a portion of a cross-bar structure having a third metal strip extending in a same direction as a first direction.

7. The method of claim 1, wherein the FE blanket layer is made of one of hafnium zirconium oxide (HfZrO), hafnium aluminum oxide (HfAlO), hafnium lanthanum oxide (HfLaO), hafnium cerium oxide (HfCeO), hafnium oxide (HfO), hafnium gadolinium oxide (HfGdO), or hafnium silicon oxide (HfSiO).

8. The method of claim 1, wherein the FE blanket layer is deposited using one of physical vapor deposition (PVD), plasma enhanced chemical vapor deposition (PECVD), atomic layer deposition (ALD), or plasma-enhanced ALD (PEALD).

9. The method of claim 1, wherein the bottom metal contacts and the cross-bar structure are made of one of titanium nitride (TiN), tantalum nitride (TaN), tungsten (W), ruthenium (Ru), or aluminum (Al).

10. The method of claim 1, wherein the bottom metal contacts and the cross-bar structure are deposited using one of PVD, chemical vapor deposition (CVD), or PECVD.

11. A method of making a capacitor, the method comprising:

forming a bottom contact extending lengthwise in a first direction on a substrate;

forming a ferroelectric layer on the bottom contact;

forming a plurality of middle contacts on the ferroelectric layer over the bottom contact; and forming a crossbar structure including a plurality of first crossbar structure strips extending lengthwise in a second direction perpendicular to the first direction on the plurality of middle contacts, such that the plurality of middle contacts are between the bottom contact and the plurality of first crossbar structure strips of the crossbar structure.

12. The method of claim 11, wherein the forming of the bottom contact comprises forming a plurality of bottom contact strips extending lengthwise in the first direction, and the forming of the crossbar structure comprises forming the plurality of first crossbar structure strips such that a plurality of intersection regions are formed between the plurality of first crossbar structure strips and the plurality of bottom contact strips.

13. The method of claim 12, wherein the forming of the plurality of middle contacts comprises forming the plurality of middle contacts at the plurality of intersection regions.

14. The method of claim 11, wherein the forming of the bottom contact comprises:

depositing a first passivation layer on the substrate;

forming a plurality of trenches extending in the first direction in the first passivation layer;

depositing a first metal material in the plurality of trenches; and planarizing the first metal material to form the bottom contact having an upper surface substantially coplanar with an upper surface of the first passivation layer.

15. The method of claim 14, wherein the forming of the ferroelectric layer comprises depositing a ferroelectric material on the bottom contact and the first passivation layer.

16. The method of claim 15, wherein the forming of the plurality of middle contacts comprises:

depositing a second metal material on the ferroelectric layer;

patterning the second metal material;

depositing a second passivation layer on the patterned second metal material and the ferroelectric layer; and planarizing the patterned second metal material to form the plurality of middle contacts having an upper surface substantially coplanar with an upper surface of the second passivation layer.

17. The method of claim 16, wherein the forming of the crossbar structure comprises:

depositing a third metal material on the plurality of middle contacts and the second passivation layer;

patterning the third metal material;

depositing a third passivation layer on the patterned third metal material and the second passivation layer; and planarizing the patterned third metal material to form the crossbar structure having an upper surface substantially coplanar with an upper surface of the third passivation layer.

18. The method of claim 11, wherein the forming of the crossbar structure comprises:

forming the plurality of first crossbar structure strips; and forming a plurality of second crossbar structure strips extending lengthwise in the first direction and intersecting the plurality of first crossbar structure strips.

19. The method of claim 18, wherein the forming of the bottom contact comprises forming a plurality of bottom contact strips extending lengthwise in the first direction, and the forming of the plurality of second crossbar structure strips comprises forming the plurality of second crossbar structure strips to be alternatingly formed with the plurality of bottom contact strips.

20. A method of making a capacitor, the method comprising:

forming a plurality of bottom metal strips extending in a first direction on a substrate;

forming a ferroelectric layer on the plurality of bottom metal strips;

forming a plurality of metal contacts on the ferroelectric layer over the plurality of bottom metal strips; and forming a crossbar structure comprising:

a plurality of first upper metal strips extending in a second direction perpendicular to the first direction such that the plurality of metal contacts are between the plurality of bottom metal strips and the plurality of first upper metal strips; and a plurality of second upper metal strips extending in the first direction, intersecting the plurality of first upper metal strips, and alternatingly formed with the plurality of bottom contact strips.

* * * * *